(12) United States Patent
Krasikov et al.

(10) Patent No.: US 11,870,002 B2
(45) Date of Patent: Jan. 9, 2024

(54) METHODS AND SYSTEMS FOR USE WITH PHOTOVOLTAIC DEVICES

(71) Applicant: First Solar, Inc., Tempe, AZ (US)

(72) Inventors: Dmitry Krasikov, Perrysburg, OH (US); Sachit Grover, Campbell, CA (US); Igor Sankin, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 217 days.

(21) Appl. No.: 17/319,989

(22) Filed: May 13, 2021

(65) Prior Publication Data

US 2021/0359152 A1 Nov. 18, 2021

Related U.S. Application Data

(60) Provisional application No. 63/024,032, filed on May 13, 2020.

(51) Int. Cl.
*H01L 31/18* (2006.01)
*H01L 31/06* (2012.01)
*H01L 31/0296* (2006.01)
*H01L 31/073* (2012.01)

(52) U.S. Cl.
CPC .... *H01L 31/1864* (2013.01); *H01L 31/02963* (2013.01); *H01L 31/06* (2013.01); *H01L 31/073* (2013.01)

(58) Field of Classification Search
CPC ........... H01L 31/1864; H01L 31/02963; H01L 31/06; H01L 31/073; H01L 31/03925; H01L 31/046; H01L 31/0488
See application file for complete search history.

(56) References Cited

U.S. PATENT DOCUMENTS

| | | | |
|---|---|---|---|
| 9,490,386 B2 | 11/2016 | Korevaar et al. | |
| 9,576,860 B2 | 2/2017 | Kumar et al. | |
| 10,896,991 B2 | 1/2021 | Jin et al. | |
| 2002/0171441 A1 | 11/2002 | Jayamaha | |
| 2015/0183057 A1 | 7/2015 | Baker et al. | |
| 2018/0040760 A1* | 2/2018 | Hallam | H01L 31/1868 |
| 2019/0305166 A1* | 10/2019 | Compaan | H01L 31/022425 |

(Continued)

OTHER PUBLICATIONS

Gostein et al., "Light soaking effects on Photovoltaic Modules: Overview and Literature Review," Proceedings of the 37th IEEE Photovoltaic Specialists Conference (PVSC), 2011, pp. 1-6.

(Continued)

*Primary Examiner* — Calvin Y Choi
(74) *Attorney, Agent, or Firm* — MacMillan, Sobanski & Todd, LLC

(57) ABSTRACT

According to embodiments provided herein, the performance of photovoltaic device can be improved by rapidly heating an absorber layer of a device in open-circuit to a high temperature for a short period of time followed by rapid quenching. The rapid heating may be accomplished by one or more pulses of high intensity electromagnetic energy. The energy may be visible light. The energy may be absorbed primarily in the absorber layer, such that the absorber layer is preferentially heated, promoting chemical reactions of dopant complexes. The dopant chemical reactions disrupt compensating defect complexes that have formed in the device, and regenerate active carriers.

20 Claims, 18 Drawing Sheets

(56) References Cited

U.S. PATENT DOCUMENTS

2020/0035853 A1* 1/2020 Okandan .............. H01L 31/032

OTHER PUBLICATIONS

Krasikov et al., "Defect interations and the role of complexes in the CdTe solar cell absorber," Journal of Materials Chemistry A, 2017, vol. 5, pp. 3503-3513.

Silverman et al., "Performance stabilization of CdTe PV modules using bias and light," 40th IEEE Photovoltaic Specialists Conference, 2014, pp. 1-6.

Sankin et al., "Kinetic Simulations of CU Doping in Cholorinated CdSeTe PV Absorbers," Physica Status Solidi A, 2019, pp. 1-11.

Dharmadasa et al., "Intense Pulsed Light Treatment of Cadmium Telluride Nanoparticle-Based Thin Films," Applied Materials and Interfaces, 2014, vol. 6, pp. 5034-5040.

\* cited by examiner

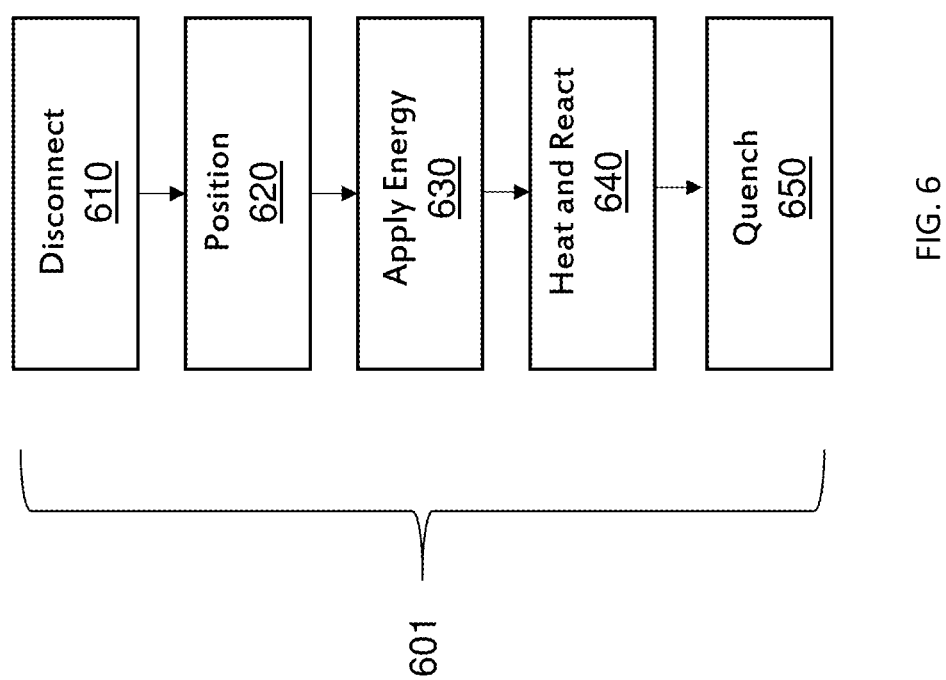

| | $Cl_i^-$ | $Cl_i^+$ | $Cl_{Te}^+$ | $Te_i^0$ | $Te_i^{2+}$ | $Te_{Cd}^0$ | $Te_{Cd}^{2+}$ | $Cu_i^+$ | $Cu_{Cd}^0$ | $Cu_{Cd}^-$ | $Cd_i^{2+}$ | $V_{Cd}^{2-}$ |
|---|---|---|---|---|---|---|---|---|---|---|---|---|
| $Cl_i^-$ | -0.04 1 | | | | | | | | | | | |
| $Cl_i^+$ | -0.82 1 | -0.72 1 | | | | | | | | | | |
| $Cl_{Te}^+$ | -1.02 1 | +0.37 1 | +0.02 1 | | | | | | | | | |
| $Te_i^0$ | -0.58 1 | +1.07 1 | -0.65 2 | +0.44 1 | | | | | | | | |
| $Te_i^{2+}$ | +0.49 1 | -0.46 1 | +0.32 1 | -1.42 1 | -0.85 1 | | | | | | | |
| $Te_{Cd}^0$ | -0.24 1 | -1.46 1 | -0.44 1 | -1.45 1 | -1.49 1 | 0.54 1 | | | | | | |
| $Te_{Cd}^{2+}$ | -1.88 1 | -0.88 1 | +0.16 1 | -1.23 1 | -0.68 1 | -0.79 1 | -0.03 1 | | | | | |
| $Cu_i^+$ | -0.04 1 | -0.33 1 | +0.01 1 | -0.47 1 | -0.11 1 | -0.57 1 | +0.05 1 | +0.16 1 | | | | |
| $Cu_{Cd}^0$ | -0.58 1 | -0.48 1 | -0.41 1 | -0.65 1 | -1.09 1 | -0.72 1 | -0.68 1 | -0.40 1 | -0.23 1 | | | |
| $Cu_{Cd}^-$ | +0.62 1 | -0.65 1 | -0.52 1 | -0.20 1 | -1.31 1 | -0.04 1 | -0.74 1 | -0.37 1 | -0.22 1 | -0.07 1 | | |
| $Cd_i^{2+}$ | +1.08 1 | -0.14 1 | +0.04 1 | -0.54 1 | +0.12 1 | -0.48 2 | +0.58 1 | +0.02 1 | -0.33 1 | -1.00 2 | +0.02 1 | |
| $V_{Cd}^{2-}$ | +0.56 3 | -0.63 3 | -0.74 3 | -0.26 3 | -2.12 3 | 0.33 1 | -0.47 1 | -1.50 3 | N/A | N/A | -2.60 3 | +0.55 1 |

FIG. 14

METHODS AND SYSTEMS FOR USE WITH PHOTOVOLTAIC DEVICES

CROSS-REFERENCE TO RELATED APPLICATIONS

This application claims the benefit of U.S. Provisional Patent Application 63/024,032, filed on May 13, 2020, which is incorporated by reference herein in its entirety.

BACKGROUND

The present specification generally relates to photovoltaic devices, and, more specifically, to a system and method for modulating defect chemistry in thin film layers containing group II-VI doped semiconductor materials and a process for reactivating charge carriers in photovoltaic devices.

A photovoltaic device generates electrical power by converting light into electricity using semiconductor materials that exhibit the photovoltaic effect. Photovoltaic devices include a number of layers divided into a plurality of photovoltaic cells. Each photovoltaic cell converts sunlight into electrical power and can be connected in series with one or more adjacent cells of a photovoltaic device. A plurality of photovoltaic devices or modules may be electrically connected into a larger array or system. Photovoltaic devices are often used in outdoor installations, in a wide range of environments, and intended to function reliably for many years. Photovoltaic devices generally degrade in performance with exposure to field conditions over time, leading to diminished energy output.

Accordingly, a need exists for systems and methods to treat formed photovoltaic devices to recover performance, reverse degradation, and improve efficiency. Moreover, it is desirable to produce photovoltaic modules that maintain similar high performance characteristics and to provide systems for extending the life expectancies of photovoltaic modules.

SUMMARY

The embodiments provided herein relate to systems and methods for efficiently treating photovoltaic devices to enhance or recover performance. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals. The patent or application file may contain at least one drawing executed in color and/or one or more photographs. Copies of this patent or patent application publication with color drawing(s) will be provided by the U.S. Patent Office upon request and payment of the necessary fee.

FIG. 6 provides a flow chart of an example method according to one or more embodiments shown and described herein.

FIG. 14 is a table showing the calculated enthalpies of the reactions between point defects under consideration. Integer numbers depict the type of each reaction: 1—complex formation, 2—exchange reaction facilitated by kick out, 3—vacancy-interstitial pair annihilation.

DETAILED DESCRIPTION

Methods and systems for improving the performance of photovoltaic devices are provided herein.

A photovoltaic device generates electrical power by converting light into electricity using semiconductor materials that exhibit the photovoltaic effect. It may include two conductive electrodes sandwiching a series of semiconductor layers, in which photo-conversion occurs. During operation, photons pass into the semiconductor layers and are absorbed at or near a p-n junction in the semiconducting layers. This produces photo-generated electron-hole pairs, the movement of which, promoted by a built-in electric field, produces electric current that can be output from the device. Device efficiency and performance may be improved by using dopants to increase an effective charge carrier concentration. Improvement from doping may be diminished over time by the formation of compensating defect complexes in the absorber region that results in degradation of the p-type doping and reduction of the built-in electric field that separates photo-generated carriers. The systems and methods described may be used to produce chemical reactions to dissociate compensating defect complexes and enhance or restore effective charge carrier concentration.

The efficiency of type II-VI semiconductor-based solar cells depends to a large degree on the electric properties of the absorber layer. Those electric properties depend on the amount and properties of the electrically active centers (i.e. crystalline defects) in it. In particular, the formation of a stronger p-type absorber doping and the mitigation of absorber recombination centers to achieve longer carrier lifetime can improve the open-circuit voltage. Additionally, the type, concentration, and distribution of crystalline defects in the absorber should remain substantially constant under field stress conditions to ensure stable device performance.

Figure 1:
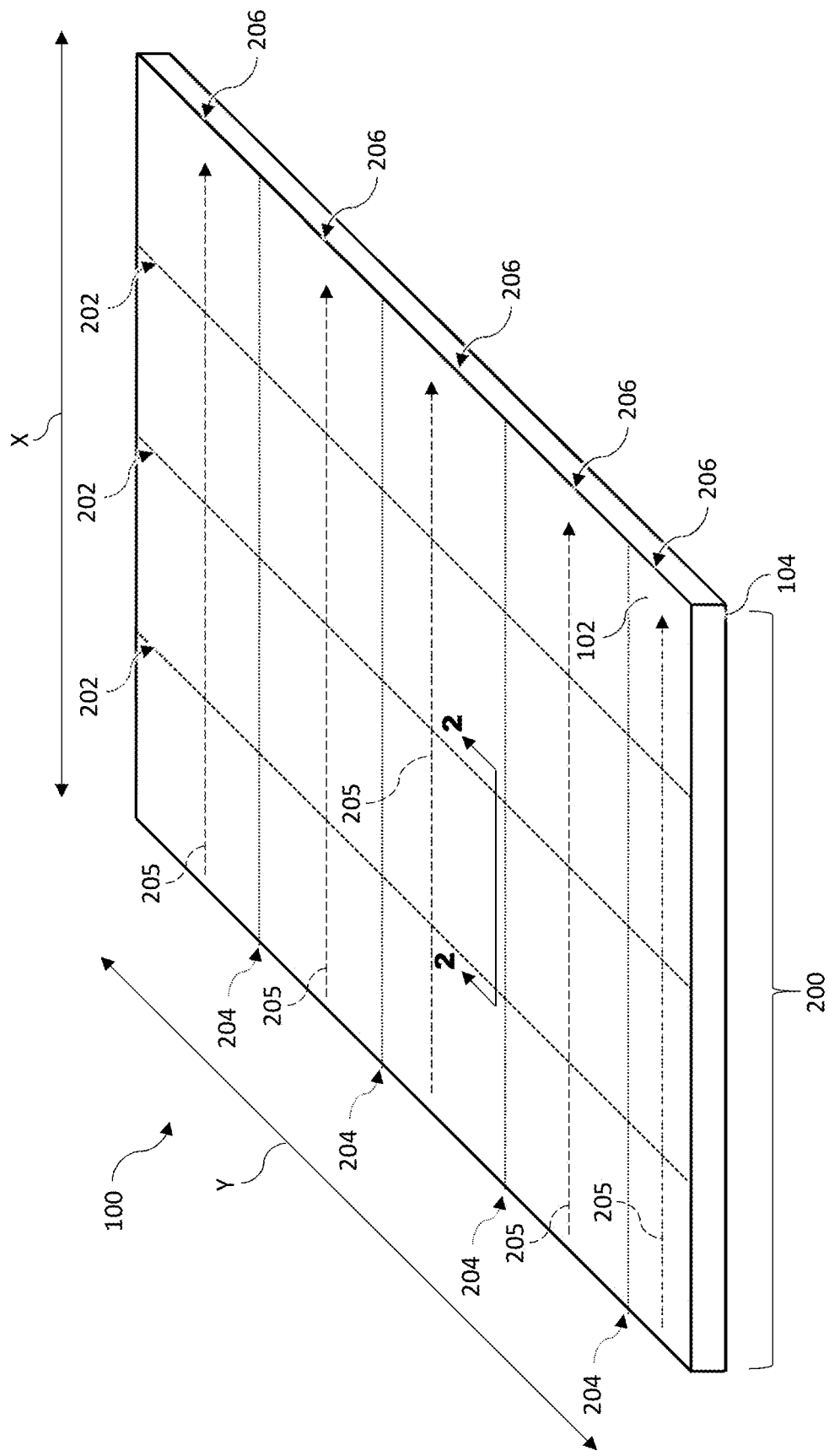
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 100 can also define an opposing side 104 offset from the energy side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The photovoltaic device 100 can include a plurality of layers disposed between the energy side 102 and the opposing side 104. As used herein, the term "layer" refers to a thickness of material provided upon a surface. Each layer can cover all or a portion of the surface. In some embodiments, the layers of the photovoltaic device 100 can be divided into an array of photovoltaic cells 200. For example, the photovoltaic device 100 can be scribed according to a plurality of serial scribes 202 and a plurality of parallel scribes 204. The serial scribes 202 can extend along a length Y of the photovoltaic device 100 and demarcate the photovoltaic cells 200 along the length Y of the photovoltaic device 100. The serial scribes 202 can be configured to connect neighboring cells of the photovoltaic cells 200 serially along a width X of the photovoltaic device 100. Serial scribes 202 can form a monolithic interconnect of the neighboring cells, i.e., adjacent to the serial scribe 202. The parallel scribes 204 can extend along the width X of the photovoltaic device 100 and demarcate the photovoltaic cells 200 along the width X of the photovoltaic device 100. Under operation, current 205 can predominantly flow along the width X through the photovoltaic cells 200 serially connected by the serial scribes 202. Under operation, parallel scribes 204 can limit the ability of current 205 to flow along the length Y. Parallel scribes 204 are optional and can be configured to separate the photovoltaic cells 200 that are connected serially into groups 206 arranged along length Y.

Referring still to FIG. 1, the parallel scribes 204 can electrically isolate the groups 206 of photovoltaic cells 200 that are connected serially. In some embodiments, the groups 206 of the photovoltaic cells 200 can be connected in parallel such as, for example, via electrical bussing. Optionally, the number of parallel scribes 204 can be configured to limit a maximum current generated by each group 206 of the photovoltaic cells 200. In some embodiments, the maximum current generated by each group 206 can be less than or equal to about 200 milliamps (mA).

Figure 2:
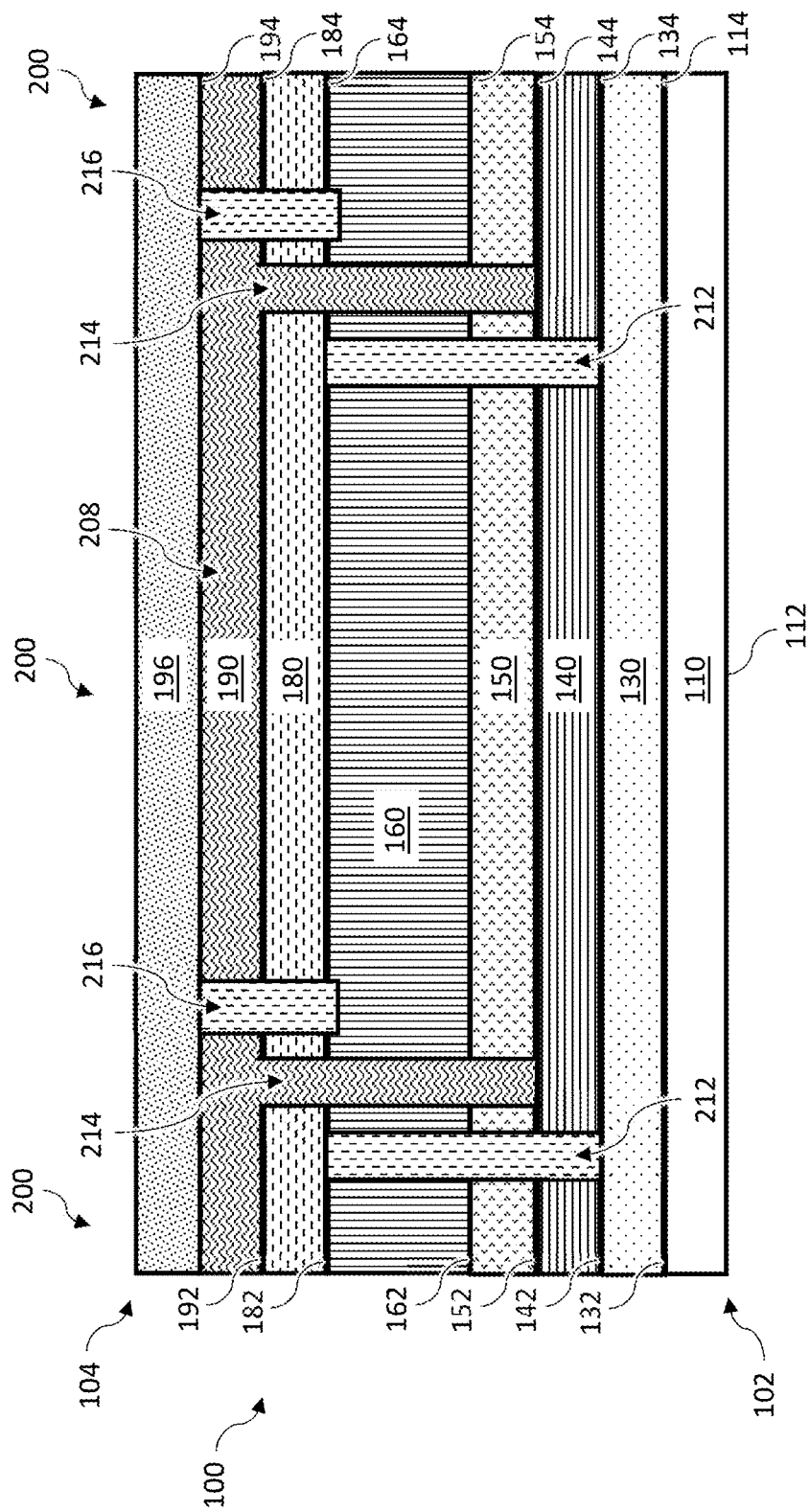
FIG. 2 schematically depicts a cross-sectional view along 2-2 of the photovoltaic device of FIG. 1 according to one or more embodiments shown and described herein.
Figure 3:
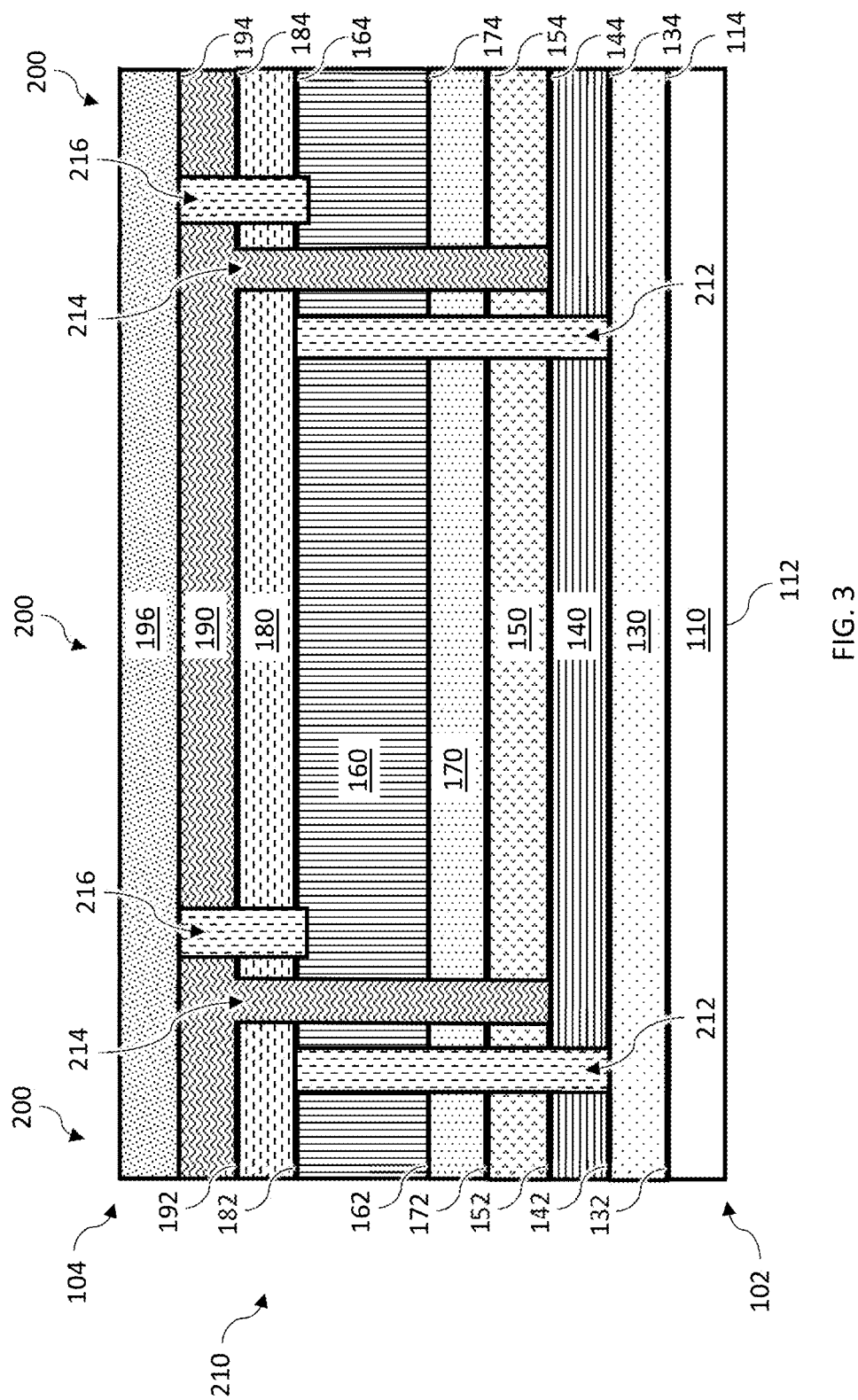
FIG. 3 schematically depicts a cross-sectional view of a photovoltaic device according to one or more embodiments shown and described herein.

Referring collectively to FIGS. 1 and 2, the layers of the photovoltaic device 100 can include a substrate 110 configured to facilitate the transmission of light into the photovoltaic device 100. The substrate 110 can be disposed at the energy side 102 of the photovoltaic device 100. Referring now to FIGS. 2 and 3, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or a glass with reduced iron content. The transparent layer 120 can have a suitable transmittance range, including about 250 nm to about 1,300 nm in some embodiments, or about 250 nm to about 950 nm in other embodiments. The transparent layer 120 may also have a suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance, or more, for electromagnetic radiation having a wavelength of about 350 nm to about 850 nm. Optionally, the substrate 110 can include a performance coating applied to a surface of the transparent layer 120. The performance coating can be configured to interact with light or to improve durability of the substrate 110 such as, but not limited to, an antireflective coating, an antisoiling coating, or combinations thereof.

Referring again to FIG. 2, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have a suitable thickness bounded by the first surface 132 and the second surface 134, including, for example, more than about 100 Å in one embodiment, more than about 150 Å in another embodiment, or less than about 200 Å in a further embodiment.

Referring still to FIG. 2, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 150 may include material having higher resistivity than the TCO layer 140, including, but not limited to, intrinsic tin dioxide, zinc magnesium oxide (e.g., $Zn_{1-x}Mg_xO$), tin dioxide ($SnO_2$), silicon dioxide ($SiO_2$), aluminum oxide ($Al_2O_3$), aluminum nitride (AlN), zinc tin oxide, zinc oxide, tin silicon oxide, or combinations thereof. In some embodiments, the material of the buffer layer 150 can be configured to substantially match the band gap of an adjacent semiconductor layer (e.g., an absorber). The buffer layer 150 may have a suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring still to FIG. 2, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 1.5 μm to about 4 μm in another embodiment. In some embodiments, a thickness of the absorber layer is less than 0.001% of the thickness of the layers between and including the substrate 110 and back support 196.

According to the embodiments described herein, the absorber layer 160 can be formed from a p-type semiconductor material having an excess of positive charge carriers, i.e., holes or acceptors. The absorber layer 160 can include a suitable p-type semiconductor material such as group II-VI semiconductors. Specific examples include, but are not limited to, semiconductor materials comprising cadmium, tellurium, selenium, or any combination thereof. Suitable examples include, but are not limited to, binary alloys of cadmium and tellurium (CdTe), ternaries of cadmium, selenium and tellurium ($CdSe_xTe_{1-x}$), or a compound comprising cadmium, selenium, tellurium, and one or more additional element. The absorber layer may further comprise one or more dopants. Photovoltaic devices may include a plurality of absorber materials. Absorber layers may be single p-n or pin junctions or tandem p-n or pin junctions.

The absorber layer 160 can be doped with dopants configured to manipulate the charge carrier concentration. In some embodiments, the absorber layer 160 can be doped with a group I or V dopant such as, for example, copper, arsenic, phosphorous, antimony, or a combination thereof. In some embodiments, dopants are introduced during a passivation step in the manufacturing process. Passivation may include, for example, treatment with $CdCl_2$ or other halide compounds, and resulting dopants may include chlorine or other halogens. The total density of all dopants within the absorber layer 160 can be controlled. Additionally, the amount of a selected dopant can vary with distance from the first surface 162 of the absorber layer 160.

The p-n junction can be formed by providing the p-type semiconductor absorber layer 160 sufficiently close to a portion of the photovoltaic device 100 having an excess of negative charge carriers, i.e., electrons or donors. In some embodiments, the p-type material of the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

An example fabrication process of a thin film photovoltaic device using CdTe may include a high-temperature annealing step at 400-450 C in the presence of chlorine and a p-type doping formation step at 200-300 C to introduce and activate Cu acceptors. Chlorine and copper introduced to CdTe at concentrations of $10^{17}$ to $10^{19}$ $cm^{-3}$ can form desirable point defects in the lattice structure of polycrystalline thin films that strongly affect the electrical performance of the absorber.

Referring now to FIG. 3, in some embodiments, a photovoltaic device 210 can include a window layer 170 comprising n-type semiconductor material. The absorber layer 160 can be formed adjacent to the window layer 170. The window layer 170 can have a first surface 172 substantially facing the energy side 102 of the photovoltaic device 100 and a second surface 174 substantially facing the opposing side 104 of the photovoltaic device 100. In some embodiments, the window layer 170 can be positioned between the absorber layer 160 and the TCO layer 20. In one embodiment, the window layer 170 can be positioned between the absorber layer 160 and the buffer layer 150. The window layer 170 can include a suitable n-type material, including, for example, cadmium sulfide, zinc sulfide, cadmium zinc sulfide, zinc magnesium oxide, cadmium selenide, oxygenated cadmium sulfide, zinc telluride, zinc selenide, indium selenide, indium sulfide, zinc oxyhydrate, or any combination thereof. The material of the window layer 170 can include dopants.

Referring collectively to FIGS. 2 and 3, the photovoltaic device 100, 210 can include a back contact layer 180 configured to mitigate undesired alteration of the dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can include binary or ternary combinations of materials from groups I, II, VI, such as for example, one or more layers containing zinc, copper, cadmium and tellurium in various compositions. Further exemplary materials include, but are not limited to, zinc telluride doped with copper telluride, or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal and/or metal, such as, silver, nickel, copper, aluminum, titanium, palladium, chrome, molybdenum, gold, or the like. Suitable examples of a nitrogen-containing metal layer can include aluminum nitride, molybdenum nitride, nickel nitride, titanium nitride, tungsten nitride, selenium nitride, tantalum nitride, or vanadium nitride.

The photovoltaic device 100, 210 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to the conducting layer 190. The back support 196 can include any suitable material, including, for example, glass (e.g., soda-lime glass). In some embodiments, an encapsulation layer can also function as the back support 196.

Referring collectively to FIGS. 2 and 3, manufacturing of a photovoltaic device 100, 210 generally includes sequentially disposing functional layers or layer precursors in a "stack" of layers through one or more thin film deposition processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). In some embodiments, VTD may be preferred for greater throughput quality. Manufacturing may also include annealing and passivating steps.

Manufacturing of photovoltaic devices 100, 210 can further include the selective removal of the certain layers of the stack of layers, i.e., scribing, to divide the photovoltaic device into 100, 210 a plurality of photovoltaic cells 200. For example, the serial scribes 202 can comprise a first isolation scribe 212 (also referred to as P1 scribe), a series connecting scribe 214 (also referred to as P2 scribe), and a second isolation scribe 216 (also referred to as P3 scribe). The first isolation scribe 212 can be formed to ensure that the TCO layer 140 is electrically isolated between cells 210. Specifically, the first isolation scribe 212 can be formed though the TCO layer 140, the buffer layer 150, and the absorber layer 160 of photovoltaic device 100, or though the TCO layer 140, the buffer layer 150, the window layer 170, and the absorber layer 160 of photovoltaic device 200.

Referring again to FIGS. 2 and 3, the series connecting scribe 214 can be formed to electrically connect photovoltaic cells 200 in series. For example, the series connecting scribe 214 can be utilized to provide a conductive path from the conductive layer 190 of one of the photovoltaic cells 200 to the TCO layer 140 of another of the photovoltaic cells 200. The series connecting scribe 214 can be formed though the absorber layer 160, and the back contact layer 180 of photovoltaic device 100, or through the window layer 170, the absorber layer 160, and the back contact layer 180 of photovoltaic device 200. Optionally, the series connecting scribe 214 can be formed though some or all of the buffer layer 150. Accordingly, the series connecting scribe 214 can be formed after the back contact layer 180 is deposited and can then be filled with a conducting material such as, but not limited to, the material of the conducting layer 190.

The second isolation scribe 216 can be formed to isolate the back contact 190 into individual cells 210. The second isolation scribe 216 can be formed through the conductive layer 190, the back contact layer 180, and at least a portion of the absorber layer 160. The second isolation scribe 216 can be filled with a dielectric material.

Referring to FIG. 1, a parallel scribe 204 (also referred to as P4 scribe) can be formed to isolate groups 206 of cells 200 from one another. In some embodiments, each group 206 can comprise multiple photovoltaic cells 200 connected in series such as, for example, via the series connecting scribe 214. The parallel scribe 204 can be formed through the conductive layer 190, the back contact layer 180, the absorber layer 160, the buffer layer 150, the TCO layer 140, the barrier layer 130, and the window layer 170 when present. According to the embodiments provided herein, each of the parallel scribe, 204, the first isolation scribe 212, the series connecting scribe 214, and the second isolation scribe 216 can be formed via laser cutting or laser scribing. In some embodiments, the parallel scribe 204 can be filled with a dielectric material.

After the layer stack with scribes is formed, bussing is added and the photovoltaic module is assembled. An encapsulation layer is applied and the semiconductor layers are sealed relative to rain, snow, and other metrological elements. As used herein, a fully-formed photovoltaic device or a completed module is one which is fully assembled, functional, and encapsulated. A deployed device is a completed module which has additionally been deployed, installed, and used in generating power from solar radiation.

Figure 4:
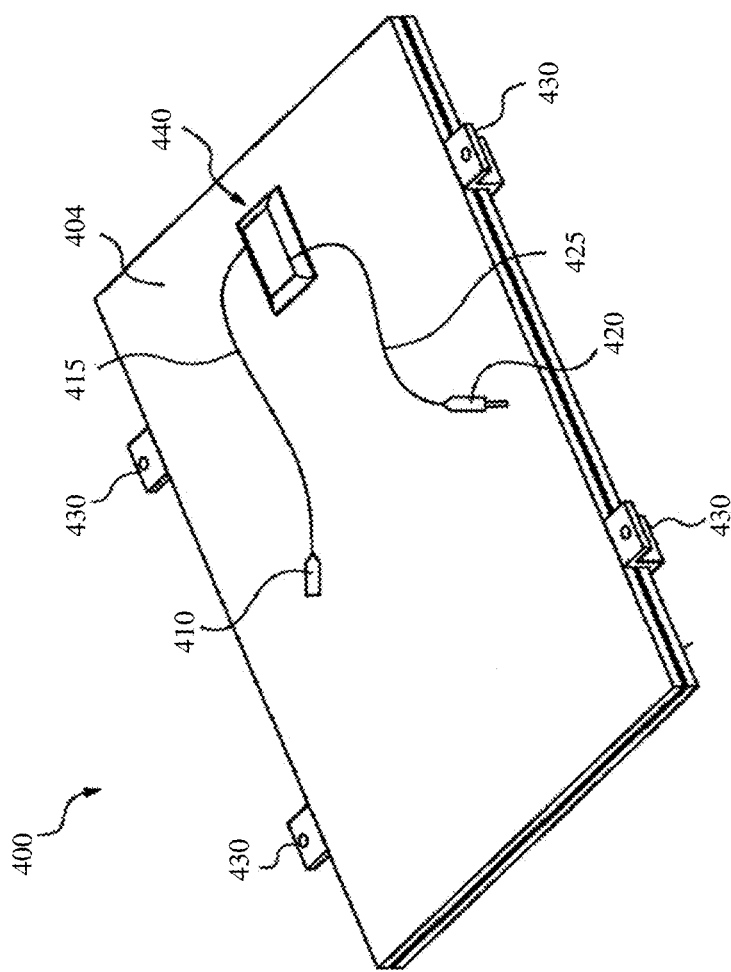
FIG. 4 is a perspective view of the back side of an example of an assembled module.

FIG. 4 shows a perspective view of the back side 404 of an example of a completed module. The module assembly 400 includes the layers described in FIGS. 1-3, as well as bussing, encapsulation, and electrical connectors. The module is configured to connect to a load through electrical connectors which pass through a junction box 440. The electrical connectors include a first cable 415 with a first terminal 410, and a second cable 425 with a second terminal 420. In some configurations additional connectors may also connect to the module. The module assembly may further include a supporting frame, bracket, or mount 430.

Photovoltaic module performance characteristics may be evaluated based on identifying the module's short circuit current (Isc), open circuit voltage (Voc), fill factor (FF), or open cell resistance (Roc) (collectively, performance variables). Short circuit current (Isc) is the current through a photovoltaic device when the voltage across the device is zero, such as when a solar cell is short circuited; it relates to the generation and collection of light-generated carriers and represents the largest current that can be drawn from the photovoltaic device. Open circuit voltage (Voc) is a value that represents the maximum voltage available from a photovoltaic device, which occurs at zero current. Fill factor (FF) is a value that represents the maximum power from a photovoltaic device and is defined as the ratio between the maximum power from the photovoltaic device and the product of Voc and Isc; a higher voltage provides a higher possible FF. Open cell resistance (Roc) is a value that represents the resistance provided from an open circuit photovoltaic device.

Figure 5B:
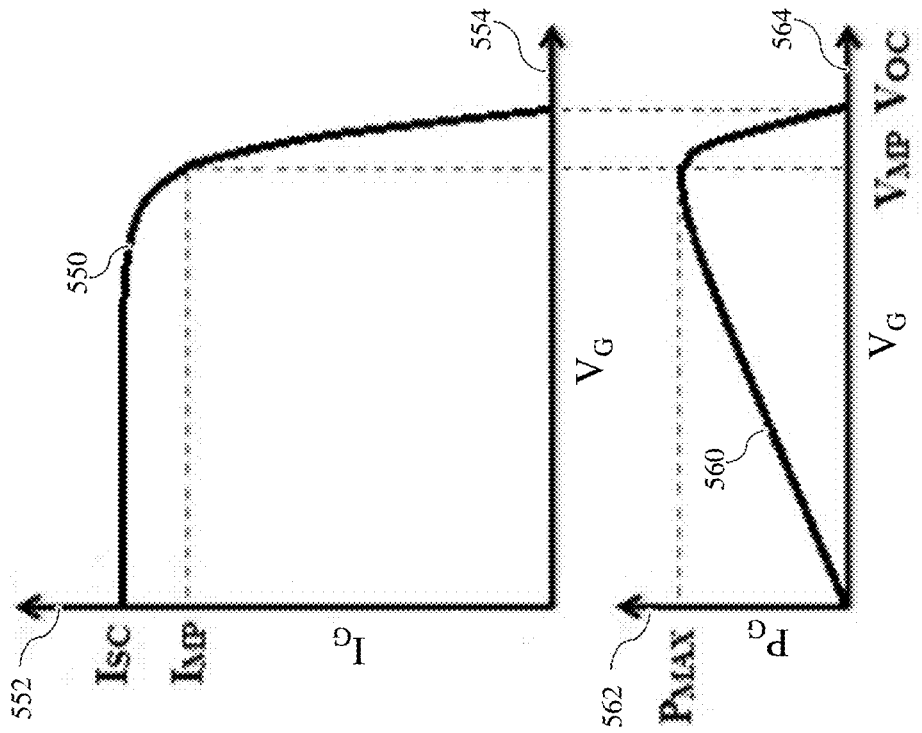
FIGS. 5A and 5B schematically depict electrical characteristics of a photovoltaic device according to one or more embodiments shown and described herein.
Figure 5A:
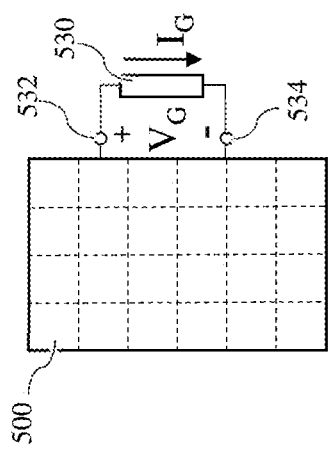

Referring collectively to FIGS. 5A and 5B, a photovoltaic device 500 can provide generated power $P_G$ to a load 530 across a first terminal 532 and a second terminal 534, i.e., a generated voltage $V_G$ and a generated current $I_G$ can be generated by the photovoltaic device 500 the first terminal 532 and the second terminal 534. The generated voltage $V_G$ and the generated current $I_G$ are represented graphically through an IV curve 550 with generated current $I_G$ increasing along the y-axis 552 and generated voltage $V_G$ increasing along the x-axis 554. A power curve 560 graphically represents the generated power $P_G$ with generated power $P_G$ increasing along the y-axis 562 and generated voltage $V_G$ increasing along the x-axis 564. The x-axis 554 and the x-axis 564 are aligned such that the IV curve 550 and the power curve 560 correspond to one another. The IV curve 550 intersects the y-axis 552 when the generated current $I_G$ is equal to the short circuit current $I_{SC}$ of the photovoltaic device 500. The short circuit current $I_{SC}$ is indicative of the maximum current of the photovoltaic device 500, and occurs when the load 530 is short circuited and the generated power $P_G$ is substantially zero. The IV curve 550 intersects the x-axis 554 when the generated voltage $V_G$ is equal to an open circuit voltage $V_{OC}$. The open circuit voltage $V_{OC}$ is indicative of a maximum voltage of the photovoltaic device 500, and occurs when the load 530 is open circuited and the generated power $P_G$ is substantially zero.

Referring to FIGS. 5A and 5B, the short circuit current $I_{SC}$ is substantially proportional to irradiance of the sun, while irradiance has a comparatively small effect on the open circuit voltage $V_{OC}$. Irradiance levels can decrease due to factors such as clouds, haze, dust, or when the sun is near the horizon. In operation, the product of the generated current $I_G$ and the generated voltage $V_G$ corresponds to the generated power $P_G$. Accordingly, the maximum generated power $P_{MAX}$ of the power curve 560 corresponds to the location of the IV curve 550 that gives the largest product of generated current $I_G$ and the generated voltage $V_G$. The generated voltage $V_G$, when the generated power $P_G$ equals the maximum generated power $P_{MAX}$, can be referred to as a maximum power voltage $V_{MP}$. The generated current $I_G$, when the generated power $P_G$ equals the maximum generated power $P_{MAX}$, can be referred to as a maximum power current $I_{MP}$.

Photo-conversion efficiency is the proportion of incident photons that the photovoltaic device converts into electric current. When photons are absorbed within the p-type semiconductor layer, electron-hole pairs generated are separated by the electric field at or near the p-n junction. Various loss mechanisms can potentially diminish photo-conversion efficiency. For instance, electrons can be lost through a process called recombination, in which excited electrons in the conduction band which could otherwise generate electric current are lost when negatively-charged electrons fall from the conduction band back to recombine with a positively-charged hole, a position in the valence band where an electron could exist. A high dopant concentration may increase the effective carrier concentration across the p-n junction at or near the interface of the p-type absorber and n-type semiconductor layer for increased photo-conversion efficiency.

Using systems and methods described herein, the performance of a completed module or fully-formed photovoltaic device can be improved by rapidly heating an absorber layer of the device in open-circuit to a high temperature for a short period of time, to induce chemical defect reactions, followed by rapid quenching. The rapid heating may be accomplished by one or more pulses of high intensity electromagnetic energy, such as a flash lamp or laser. The energy passes through transparent layers in front of the absorber layer to be absorbed primarily in the absorber layer, such that the absorber layer is preferentially heated. The application of the energy is brief and the selected wavelength produces little or no heating in the layers in front of the absorber layer. Because the mass of the absorber layer is low relative to the other layers of the device which are cooler, the high temperature induced in the absorber layer quickly dissipates throughout the device so that rapid quenching may occur passively. The dopant chemical defect reactions may entail disruption of compensating carrier complexes that have formed in the device, and regeneration of active carriers.

Module performance may be improved by treating finished, but un-deployed photovoltaic modules just prior to shipping, or by treating degraded existing modules after deployment in the field, or both. Performance improvements may be observed in either case by increases in power output and by increases in effective carrier concentration as estimated by capacitance-voltage (CV) analysis.

Turning to FIG. 6, a simplified flowchart depicting an example reactivation treatment method 601 is shown according to some embodiments of the invention.

A module is selected for treatment and is put into an open circuit configuration 610. This may entail disconnecting an in-service deployed module from a photovoltaic array. Alternately, it may entail ensuring that there are no electrical connections to one or more leads of the module. Optionally, it may include attaching an insulating sleeve or other insulating safety device to one or more of the terminal connectors.

A treatment apparatus is positioned near the module 620. This may entail positioning the module relative to the treatment apparatus, positioning the treatment apparatus relative to the module, or both.

Energy is directed from the treatment apparatus to the energy side of the module to apply energy 630. The energy may be light energy having a wavelength absorbed by a p-type semiconductor material comprising the absorber layer. In some embodiments, the energy is applied for microseconds, milliseconds, 1-10 seconds, 60 seconds or for a duration of up to a few minutes.

The absorption of the energy produces heating in the absorber layer, promoting chemical reactions 640, these reactions include dissociation of undesirable dopant complexes. The heating in the absorber layer, induced by absorbing the energy while the module is in open-circuit, may produce temperatures in the absorber layer in a range of 200 C to 1200 C, 200 C to 1000 C, 200 C to 800 C, 200 C to 700 C, 250 C to 800 C, 250 C to 700 C, 300 C to 700 C, 300 C to 600 C, or 300 C to 500 C. The energy may be applied for a duration in a range from 100 nanoseconds to 10 seconds, 100 nanoseconds to 10 milliseconds, 0.001 milliseconds to 10 seconds, from 0.001 milliseconds to 5 seconds, or from 0.01 milliseconds to 1 second. The energy may be provided by one or more pulses of electromagnetic energy configured to deliver radiant exposure at a level of from 0.1 J/cm$^2$ to 2000 J/cm$^2$, 1.0 J/cm$^2$ to 1000 J/cm$^2$, 10 J/cm$^2$ to 500 J/cm$^2$, or 20 J/cm$^2$ to 200 J/cm$^2$.

After directing energy to the module is complete, the reactions are quenched 650. Quenching may be active or passive. Quenching may entail reducing the temperature of the absorber layer. In some embodiments, the temperature of the absorber layer is reduced to below 100 C within two minutes of initiating the step of applying energy. Passive quenching may include thermal conduction and dissipation of heat from the absorber layer to other layers of the device. While the induced temperatures are high, the mass of the absorber layer is low relative to the device. Thus, during passive quenching, the thermal mass of the other layers can absorb the heat without substantial heating of layers that could be damaged by high temperatures. Active quenching may also be used. Active quenching may include directing a fluid to contact a surface of the module. For example, compressed gas or fans may be used to direct air towards the module or sprayers may be used to spray a liquid, such as water, onto a surface of the module to accelerate cooling.

In some embodiments, the period between initiating the step of applying energy and reducing the temperature of the absorber layer to below 100 C is a period of 0.1-360 seconds, 1-120 seconds, 5-30 seconds, 30-90 seconds, less than 60 seconds, 0.1-60 seconds, 1-30 seconds, 1-10 seconds, 0.1-5 seconds, 0.1-3 seconds, or 0.1-2 seconds, or about 5 seconds.

Figure 7B:
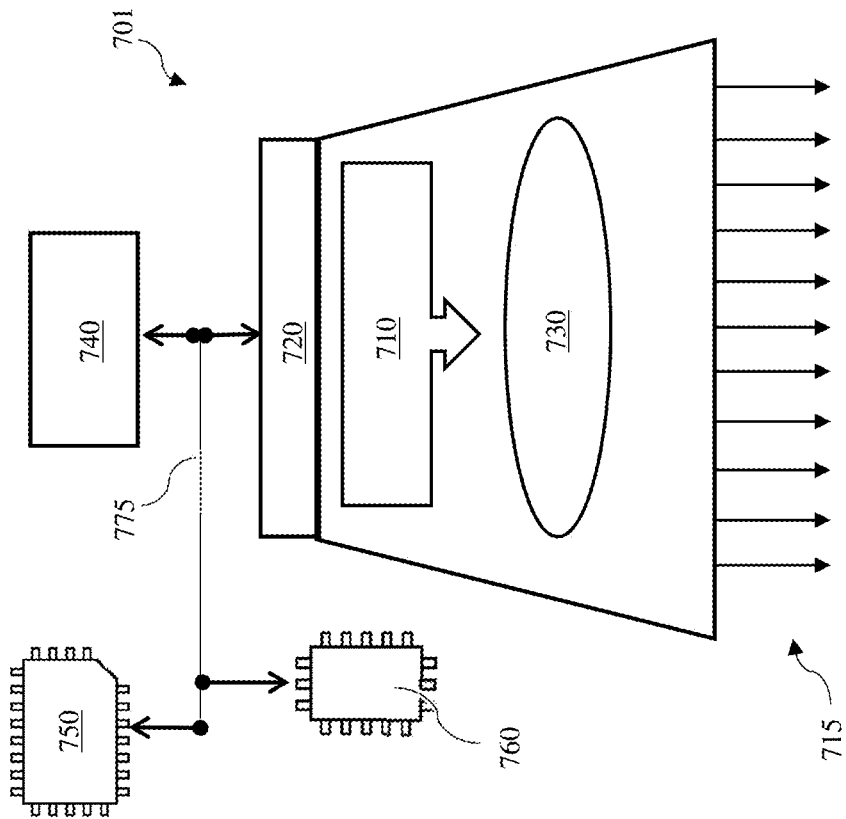
FIGS. 7A and 7B schematically depict an example system according to one or more embodiments shown and described herein.
Figure 7A:
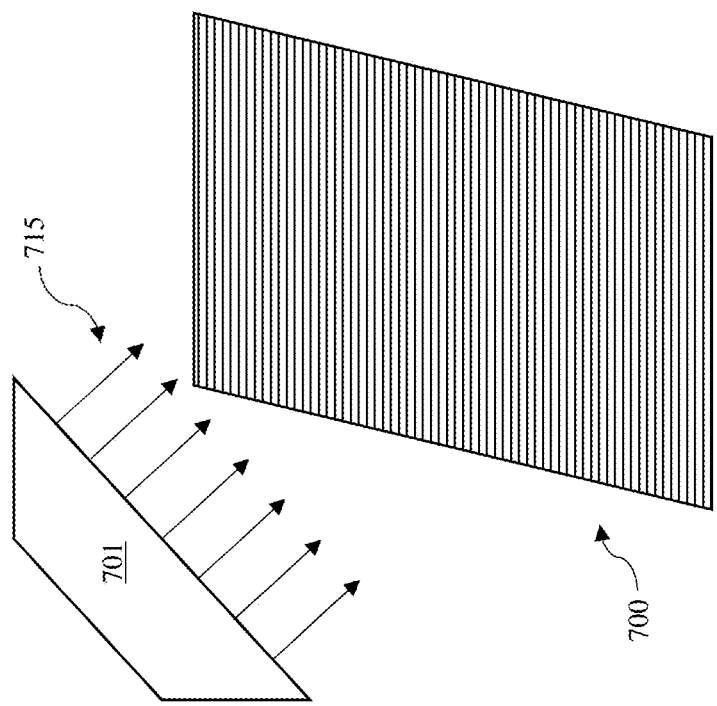

FIGS. 7A and 7B show an example system or treatment apparatus 701. FIG. 7A depicts the treatment apparatus 701 directing light 715 toward an energy side of the module 700.

FIG. 7B shows components of the example treatment apparatus 701. The treatment system includes a light source 710. It may also include additional light sources and one or more light focusing structures such as a reflector or lens 730. The treatment apparatus 701 may include one or more positioners 720. It may also include one or more communicatively coupled 775 control interfaces 740, processors 750, and/or memory components 760. The treatment apparatus may also include a power source, such as a battery or generator.

Processing steps in treating a device may be accomplished using a system with one or more processors 750. According to the embodiments described herein, a processor means any device capable of executing machine readable instructions. Accordingly, each of the one or more processors may be a controller, an integrated circuit, a microchip, a computer, or any other computing device. The one or more processors can be configured to execute logic or software and perform functions that control relative movement of a treatment device and the layer stack, as well as the properties of the treatment device, such as a duration, location, or intensity. The one or more processors can be configured to execute logic or software and perform functions that control relative movement of a treatment apparatus and the layer stack or module, as well as the properties of the treatment apparatus, such as temperature or a photonic intensity and duration. The one or more processors can be configured to execute logic or software and perform functions that control relative movement of all or part of a treatment device and the layer stack, as well as the properties of the light delivered during the treatment. Additionally, the one or more processors can be communicatively coupled to one or more memory components that can store the logic and/or input received by the one or more processors. The memory components described herein may be RAM, ROM, a flash memory, a hard drive, or any device capable of storing machine readable instructions.

As used herein, the term "communicatively coupled" means that the components are capable of exchanging data signals with one another such as, for example, electrical signals via conductive medium, electromagnetic signals via air, optical signals via optical waveguides, and the like.

Embodiments of the present disclosure comprise logic that includes machine readable instructions or an algorithm written in any programming language of any generation (e.g., 1GL, 2GL, 3GL, 4GL, or 5GL) such as, e.g., machine language that may be directly executed by the processor, or assembly language, object-oriented programming (OOP), scripting languages, microcode, etc., that may be compiled or assembled into machine readable instructions and stored on a machine readable medium. Alternatively, the logic or algorithm may be written in a hardware description language (HDL), such as logic implemented via either a field-programmable gate array (FPGA) configuration or an application-specific integrated circuit (ASIC), and their equivalents. Accordingly, the logic may be implemented in any conventional computer programming language, as pre-programmed hardware elements, or as a combination of hardware and software components.

The logic can be configured such that, when executed by the one or more processors 750, the system operates to automatically control relative movement of a treatment apparatus and the layer stack, as well as the properties of the treatment apparatus, such as light intensity and duration. The logic can be configured such that, when executed by the one or more processors, the system operates to automatically synchronize relative movement between the light source 710 and the photovoltaic module 700, by the positioners 720, and may also control modulation of parameters of the light source 710 or light 715 directed to the module 700. The light source may include, but is not limited to, high power metal halide lamps, gas lasers, Xenon discharge lights, a collimated beam, a laser waveform, a set of LEDs, a halogen lamp, and other light sources producing energy having at least one wavelength in a range of about 200-1200 nm, or preferably 300-900 nm and producing radiant exposure at a level in a range from 0.1 J/cm$^2$ to 2000 J/cm$^2$.

The described method, including the selective rapid heating of the absorber by light absorption and subsequent rapid quenching, differs from other processes used to treat semiconductor materials or photovoltaic modules with light energy. Other processes, such as layer-formation annealing or light conditioning, differ in both the steps performed and results achieved.

High intensity light or energy exposure has been used in manufacturing annealing steps during the formation of semiconductor layers and prior to the completion of a module. The present method differs from a traditional manufacturing annealing step in that it is performed on a fully-formed device and the short exposure duration does not produce substantial recrystallization. Further, the present process is not characterized by substantial dopant migration, grain size change, or lattice structure alteration.

In other processes, light exposure has been used in testing and conditioning CdTe devices, and other type II-VI photovoltaic modules. For example, accelerated life testing (ALT) can be performed at established Standard Test Conditions (STC), which, in some protocols, corresponds to a light intensity of 1000 W/m$^2$ at 25 degrees Celsius, with a reference solar spectral irradiance called Air Mass 1.5 (AM 1.5), and the test duration typically ranges from 24 hours to 300 hours. The present method differs from life testing and light-soak conditioning, which typically includes exposure of a device connected to a load or under bias to illumination of approximately 1 sun for an extended duration. Those conditions have been associated with reversible metastable changes in performance or with long-term degradation, but have no known relevance to dissociation of compensating donor complexes.

A primary benefit of incorporating dopants in p-type absorber layers is to add "defects" in the native crystal lattice that increase the number and/or concentration of electron acceptor sites. In II-VI absorbers (e.g. CdTe or $CdSe_xTe_{(1-x)}$), doping with a group IB dopant, for example: Cu, Ag, or Au, ideally places the dopant ions, such as Cu ions, on cation sites in the lattice (this may be represented as $Cu_{Cd}$), which forms an acceptor site as is desirable in p-type semiconductors. Dopants may also include impurities incorporated as a by-product or consequence of manufacturing processes. For example, during passivation, a halide (e.g. Br, F, and often Cl) may be incorporated into the absorber layer. Typically, dopant constituents comprise, on average throughout a layer, less than about one atomic percent of the doped layer, though this may be higher in some embodiments.

Figure 13A:
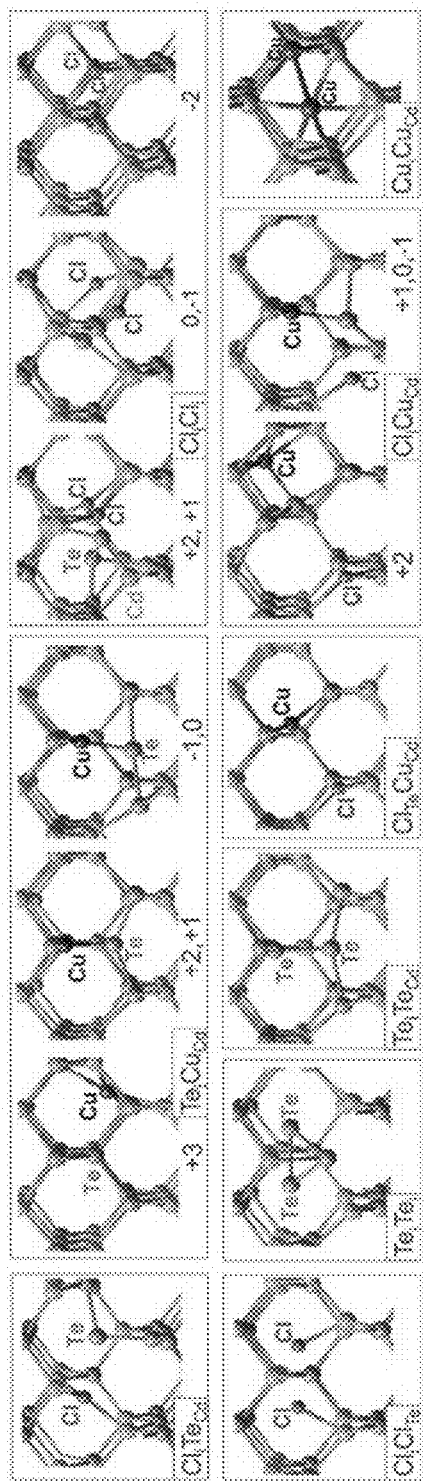
FIGS. 13A-C show aspects of doping in a CdTe thin film lattice.
Figure 13B:
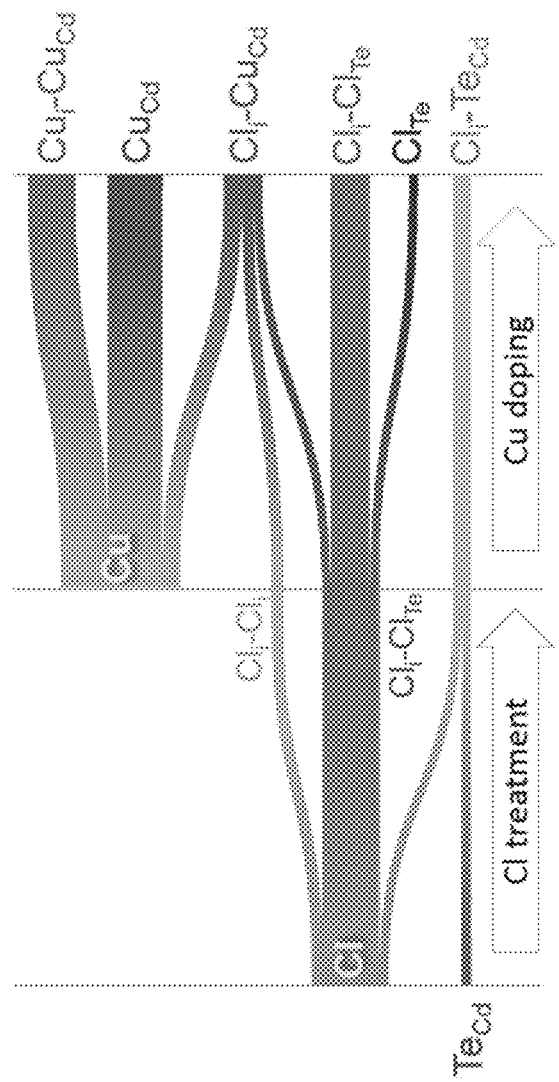
Figure 13C:
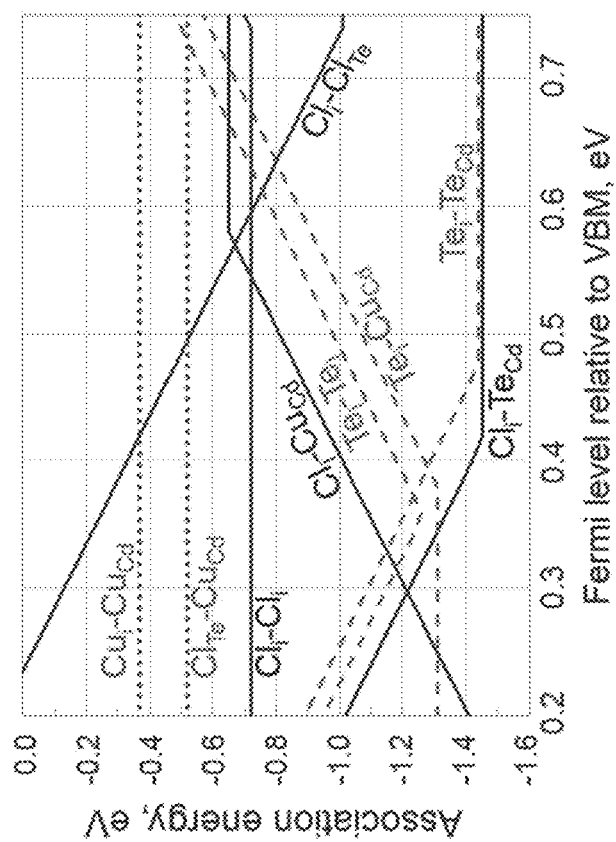

Different point defects may be formed in a in a crystal lattice. FIG. 13A shows selected examples of molecular structure for a cadmium telluride lattice with copper and chlorine dopants. FIG. 13B shows a Sankey diagram qualitatively showing an example of defect evolution during Cl treatment and Cu doping stages of the manufacturing process. Exact concentrations and flows depend on process conditions and other variables. FIG. 13C shows the association energies of the most favorable complexes in the intrinsic and p-type CdTe. The horizontal lines indicate defect association without the change of charge state; the inclined lines indicate association with the change of charge state.

$Cu_{Cd}$ is one desirable "defect" for p-type doping of CdTe, however, many other point defect sites can be formed with typical doping combinations, some of which are beneficial, while others are detrimental. For example, a double acceptor site is formed by a cadmium vacancy $V_{Cd}$ defect. However, some defects form donor sites instead, which is undesirable for p-type semiconductors. For example, the cadmium antisite $Cd_{Te}$, the tellurium vacancy $V_{Te}$ and the interstitial cadmium $Cd_i$ are (shallow) double donors; while the interstitial tellurium $Te_i$ and the tellurium antisite $Te_{Cd}$ are (deep) double donors. Interstitial copper $Cu_i$ and the chlorine on a tellurium site $Cl_{Te}$ are (shallow) donors. The interstitial chlorine $Cl_i$ may act as a donor or an acceptor depending on its position in the CdTe lattice. Whether an acceptor or donor is single or double, or deep, non-shallow, or shallow impacts the process only in magnitude, not in substance. The objective of intentional doping with group IB elements is to increase the density of acceptor sites that are not compensated by the donor sites.

In addition to the point defects described above, dopants introduced into the II-VI semiconductor can, under certain conditions, migrate and form complexes in reactions that are reversible under some conditions. Complex defect reactions are based on one of three reversible mechanisms:

(1) the association/dissociation of a complex, (i.e. Defect1+Defect2⇔Complex Defect);
(2) the exchange reactions facilitated by kick-out (i.e. $A_i+B_A \Leftrightarrow A_A+B_i$) the interstitial defect $A_i$ kicks out a substitutional point defect $B_A$ formed by element B on the lattice site belonging to element A, to restore the $A_A$ regular lattice and produce an interstitial defect $B_i$.

(3) the recombination/formation of a vacancy and an interstitial defect (i.e. $B_i+V_A \Leftrightarrow B_A$), in which an interstitial defect comes close to a vacancy and, by recombination, falls into it, which is usually energetically favorable.

The term "dopant chemical reaction," "chemical reaction," or "defect reaction" as used herein refers to the formation or reversible recombination of any of the above described dopant chemical reactions. The term "dopant complex reaction" or "complex reaction" refers specifically to the first dopant reaction mechanism above, the association/disassociation of two point defects into a complex.

The various permutations for bimolecular dopant chemical reactions in a CdTe absorber doped with Cu and Cl, for example, are shown in FIG. 14, along with the calculated enthalpies of formation and an integer indicating the type of mechanistic reaction (described above) that each complex formation/recombination represents.

Of the 78 possible permutations of point defect bimolecular interactions in an exemplary CdTe absorber doped with Cu and Cl, the large majority (66) are of the complex formation mechanism (1), hence "dopant complex reaction." While dopant reactions may produce either desirable acceptors or undesirable donors, of the most probable complex formation reactions (i.e. those with the most negative enthalpies) complex formation is of a compensating donor character or neutral, suggesting that, over time, compensating complex formation is a significant contributor to degradation of photovoltaic device performance. As used herein, for a lattice structure comprising group II-VI semiconductor materials, a "Cd" subscript, or a "C" subscript, may be used to indicate a position on a cation site; a "Te," Se," or "A" subscript may be used to indicate a position on an anion site; and an "i" subscript may be used to indicate an interstitial position.

As noted, the reactions are reversible under certain conditions. Without wishing to be bound by theory, it is believed that the dominant reactions characterizing the present process are dissociation reactions of dopant complexes. In particular, the process dissociates compensating donor complexes and promotes metal dopant positioning on cation sites forming acceptors. Shown below is a simplified equation of an abbreviated and aggregated reaction in an example device having a type II-VI absorber layer, such as cadmium telluride or cadmium selenium telluride, in which the absorber, during manufacturing, was doped with copper and treated with $CdCl_2$.

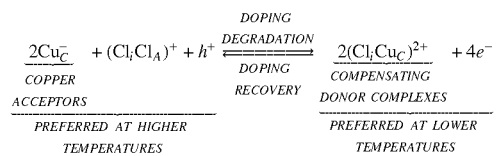

A degradation of doping occurs in the forward direction by formation of compensating donor complexes, such as $Cl_iCu_C^{2+}$, by cooling temperatures and by diffusion or migration over time. At higher temperatures, the reaction equilibrium shifts to the left-hand side of the equation, producing Cu dopant atoms that disassociate from complexes and can stay on cation sites forming acceptors such as $Cu_C^-$.

It should be noted that the conditions that favor the disadvantageous compensating complex formation can be found in at least two key situations. First, during PV device manufacturing, there typically are steps after the absorber deposition that involve re-heating the device. These include at least back contact formation and encapsulation. Such re-heating steps may initially drive the equilibrium to the left-hand side to dissociate complexes but, upon cooling, the degradation reaction is again preferred. Relative to dopant carrier concentration in the initial, as-deposited absorber, each such heating and subsequent slow cooling steps may cause further degradation, even before the PV device is deployed for use in the field. Second, upon use in the field over time, degradation of PV devices is a known problem, and has been attributed to diurnal heating and re-cooling or to diffusion over time.

As a result, the present process may find application in at least two instances. First, it may be employed to "reactivate" dopant in the finished or fully formed module before shipping and deployment. Second, it may be employed on modules that have already been deployed and have suffered degeneration over time.

In the reactivation process, the absorber layer is brought to a high temperature to dissociate donor complexes in the lattice structure, and then quickly quenched to "freeze" it in a state away from the low-T equilibrium, so that most of the group IB atoms, such as copper or silver, remain on cation sites, in an acceptor state. While doping degradation reactions would still occur over time, the reactivated absorber layer would take years to equilibrate or re-equilibrate with increased compensating donor complexes at operating field temperatures, which are typically below 70 C.

The electromagnetic energy may be in the visible range or in the ultraviolet or infrared range and may be "spectral" or polychromatic, utilizing many wavelengths (as in white light) or it may be monochromatic, involving only one wavelength. Flash lamps and lasers are both useful for the heating step.

The light or electromagnetic energy need not be continuously applied, but may be pulsed. By exposing the photovoltaic device to pulsed electromagnetic energy, heating and quenching steps that generate rapidly rising and falling temperature profiles can be produced. Very short duration pulses of high intensity electromagnetic energy may provide better results for several reasons. It is desirable to heat only, or primarily, the absorber layer. Shorter pulses of energy can reduce the amount of energy that dissipates into other areas of a photovoltaic device. Further, as other regions of the module (e.g. glass substrate, back contacts, windows, etc.) absorb the energy and heat up, the rate of cooling/quenching slows down. Thus, shorter pulses of higher intensity produce thermal profiles with more rapid ramp to the maximum temperature and more rapid cooling to ambient, or to temperatures below which dopant compensating complex recombination reactions are not thermodynamically favored.

The following non-limiting examples are provided to further illustrate the systems and methods.

Example: Testing Reactivation After Stress Test—Cadmium Selenium Telluride

The reactivation method was tested using a 1-5 second metal halide light pulse on devices with a copper-doped cadmium selenium telluride absorber layer after 1 year of light soak stress at 75-95 C. The reactivation method was tested and showed that heating a copper-doped CdSeTe absorber layer by a white light flash-lamp to a temperature of 300 C for a duration of one to eight, or about five seconds, was sufficient to recover doping activation. As a result of the treatment, doping was increased about one order of magnitude and device performance recovered to pre-stress value. No movement of the copper dopant within the lattice was detected. It was inferred that local dissociation of $Cl_iCu_{Cd}$ was produced within the lattice. Measurements of charge carrier concentrations were made with capacitance-voltage technique. In-situ power measurements were performed in ALT setup.

Figure 8A:
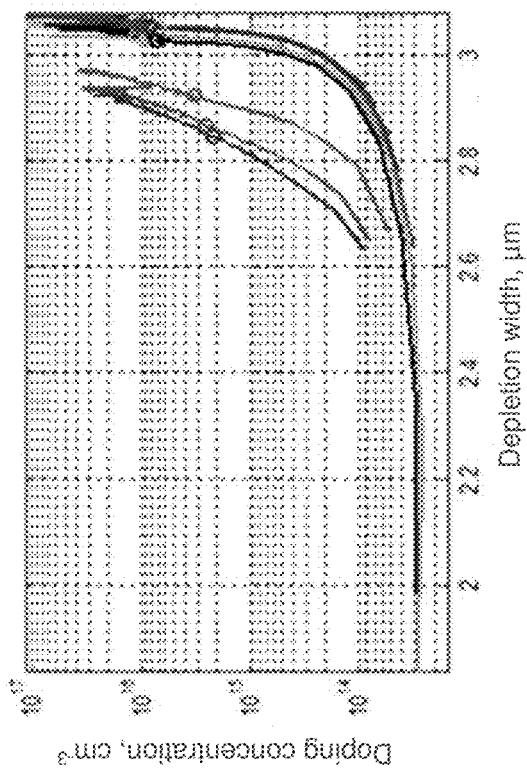
FIGS. 8A, 8B, and 8C depict measurements of devices subjected to a stress test protocol and treated with a light pulse.
Figure 8C:
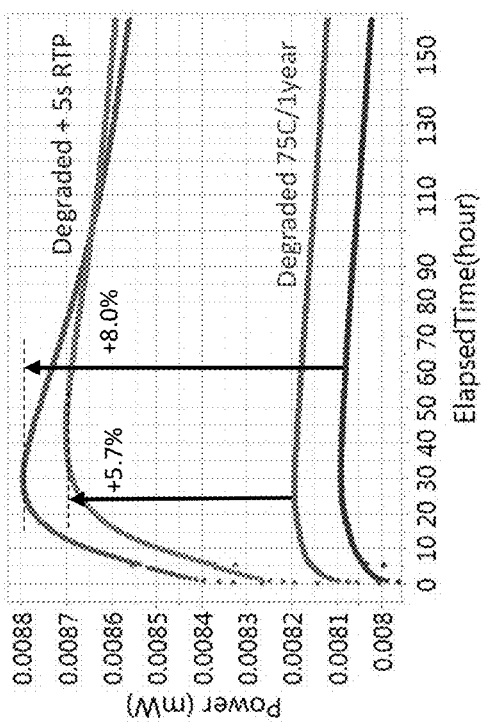
Figure 8B:
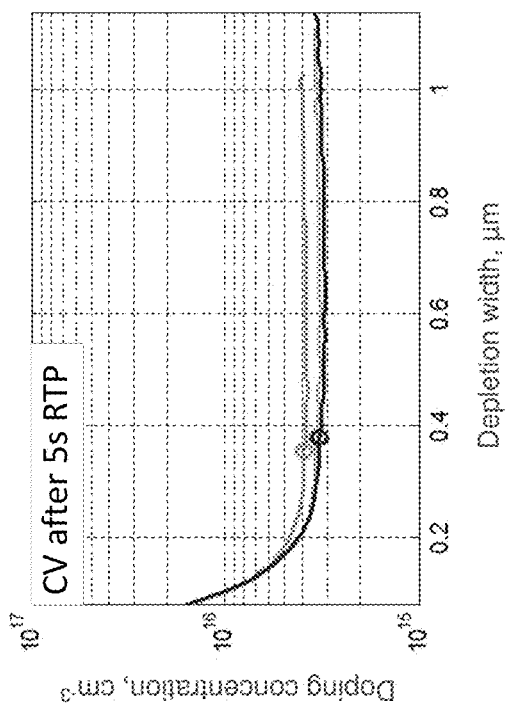

Referring to FIGS. 8A and 8B, measurement by capacitance-voltage of effective charge carrier concentrations showed increased up to between $3 \times 10^{15}$ cm$^{-3}$ to $3 \times 10^{15}$ cm$^{-3}$. The rapid thermal processing (RTP) treatment using light-induced heating of the cadmium selenide telluride absorber layer improved charge carrier concentration, as measured by CV. Referring to FIG. 8C, an ALT with in-situ power measurement showed power improvement of 5.7% to 8.0% relative to untreated controls during subsequent stress testing.

Figures 9A, 9B:
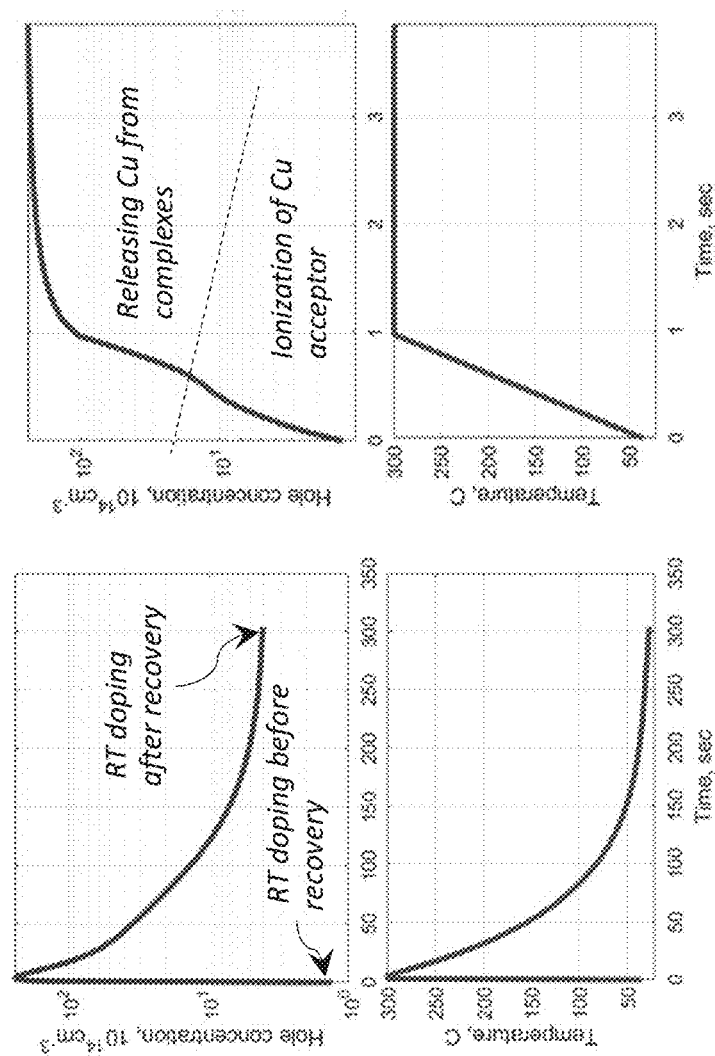
FIG. 9A shows simulated charge carrier concentration and temperature during and following treatment.
FIG. 9B shows simulated charge carrier concentration and temperature ramp during the first three seconds of treatment.

FIG. 9A shows simulated charge carrier concentration and temperature during and following treatment. FIG. 9B shows simulated charge carrier concentration and temperature ramp during the first three seconds of treatment.

Example: Field Treatment In-Situ

The performance of a thin-film CdTe-based device with chlorinated Cu-doped absorber region is known to gradually degrade under standard operating conditions. This degradation is largely caused by the formation of compensating donor defects in the absorber region that results in degradation of the p-type doping and reduction of built-in electric field that separates photo-generated carriers.

Performance of a degraded device can be fully recovered by a rapid anneal using optical energy source with a wavelength within the absorption range of CdTe. The absorbed optical power dissipates in the absorber region in the form of heat that activates the defect reactions that convert compensating donor defects to acceptors and recover p-type doping. A mobile reactivation system having a source of optical power may be used to recover the performance of installed modules.

In some instances, depending on the materials and wavelength(s) used, the wavelength may be beyond absorption edge of the absorber layer, and, the electromagnetic energy is converted to heat in another layer, such as a metal contact or heavily-doped TCO layer, and the heat is transferred into absorber layer. In some instances the energy is absorbed by a back contact, a metal contact, an electron reflector layer, a heavily-doped TCO layer, a front electrode layer, or a back electrode layer. In embodiments with passive quenching, the absorber layer alone or in combination with another layer absorbing the energy, has a low mass relative to the device as a whole, facilitating rapid passive quenching. In some embodiments, the mass of the layer or layers absorbing 80-100% of the energy comprises less than 5%, or less than 1%, of the mass of the device.

An installed module may include a CdTe layer having an effective p-type charge carrier density in a range of $1 \times 10^{14}$ cm$^{-3}$ to $5 \times 10^{15}$ cm$^{-3}$ at the time of manufacturing. The effective p-type charge carrier density may degrade over a period of time, for example over a period of ten years, such that the effective p-type charge carrier density is below $1 \times 10^{14}$ cm$^{-3}$ or is not measurable by the non-destructive method conventionally used, e.g. capacitance-voltage or CV. Chemical reactions related to dopants within the p-type semiconducting layer can contribute to diminished effective charge carrier density. The reactivation treatment can recover module performance to a level at, near, or even above the nominal rating and the effective charge carrier concentration of the device at the time of manufacturing.

A treatment apparatus is positioned near the module. The apparatus is secured to the module by a removable mount and the reactivation treatment apparatus is aligned relative to the module.

The reactivation treatment system may be positioned proximate to a mounted and deployed photovoltaic module device in the field. The system may optionally include a first insulating contact and a second insulating contact configured to respectively engage conductive terminals of the module which electrically connect to the positive or negative electrodes of the photovoltaic device. Connecting the terminals of the conductive leads to the insulating contacts prevents completion of the circuit and ensures that the device is in an open circuit condition during the treatment.

The treatment system includes a light source. It may also include a plurality of light sources and one or more light focusing structures such as a reflector or lens. The treatment apparatus may include one or more positioners for aligning the light source relative to the module. Light energy is directed from the light source of the treatment apparatus to the energy side of the module. The light source is configured to generate at least one wavelength in a range of 300-900 nm, at an intensity to deliver radiant exposure at a level of from 1.0 J/cm$^2$ to 2000 J/cm$^2$, over a duration in a range from 0.001 milliseconds to 10 seconds. The light energy is directed to substantially all of the energy side of the module either sequentially or simultaneously. The portion of surface area simultaneously treated may be constrained by power availability in the field and thus portions of the module may be treated sequentially. As the device is in open circuit, the portion treated does not require selection relative to cell position or relative to scribe lines. Because the device is in open circuit, the delivered light energy is converted by the photovoltaic effect to heat, rather than current.

The described methods are useful for recovering performance of a degraded photovoltaic device. In some embodiments, a degraded device may be defined as a module having a decrease in power output efficiency, relative to nameplate parameters or a nominal rating, of greater than 15%, such that the power output of the degraded device is less than 85% of the nominal rating for the device as-manufactured. In some embodiments, a degraded device is treated and performance, as measured by power output efficiency, recovers to within 5% of the nominal rating such that its performance, as measured by power output efficiency, recovers to at least 95% of the nominal rating. In some embodiments, a degraded device is treated and performance, as measured by power output efficiency, recovers to at or above the nominal rating. The methods may be used to boost performance of an installed photovoltaic module.

Example: Post-Manufacturing End-of-Line Treatment

During the manufacturing of photovoltaic modules, extended thermal treatments and minor variations in process parameters may result in modules having less than optimal effective charge carrier concentration and/or diminished performance characteristics. Therefore, it is desirable to manufacture modules that exhibit similar performance characteristics when installed in the field, that maintain similar performance characteristics over the life expectancies of the modules, and that extend the life expectancies of the modules.

Figure 10B:
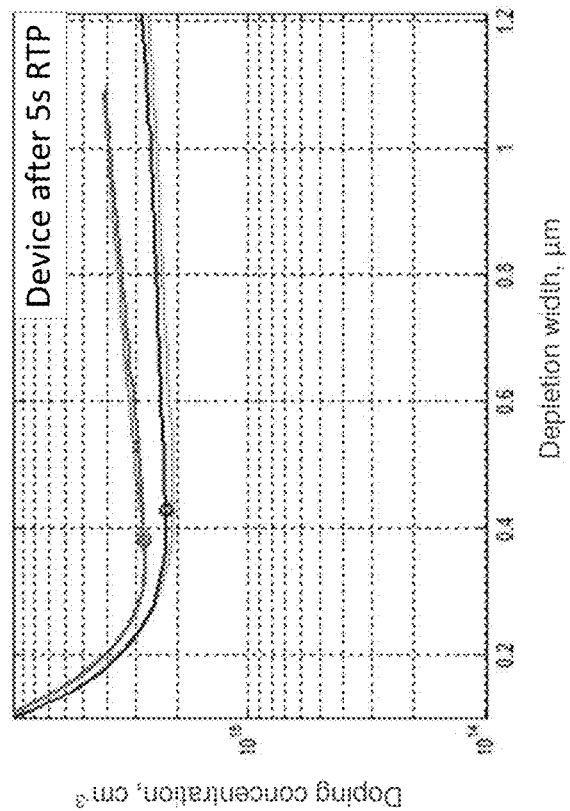
FIGS. 10A-10C show measurements from newly manufactured devices after a five second treatment.
Figure 10A:
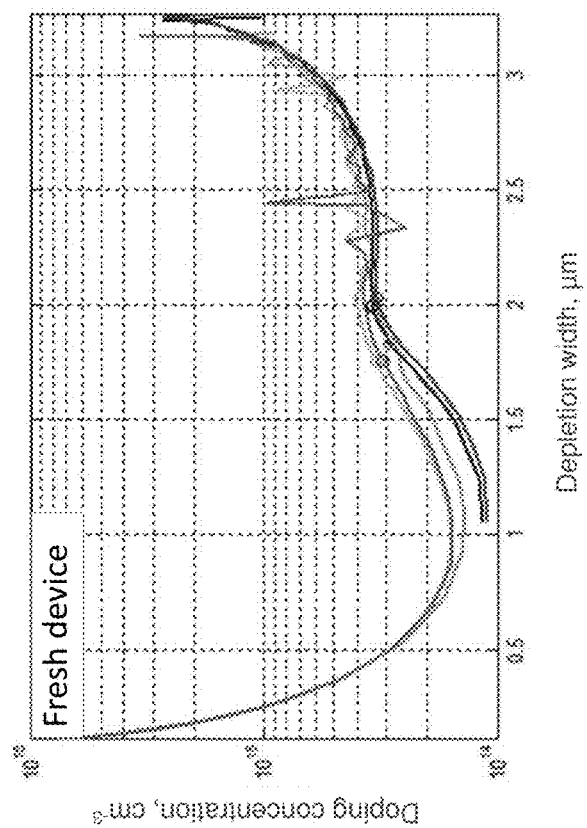
Figure 10C:
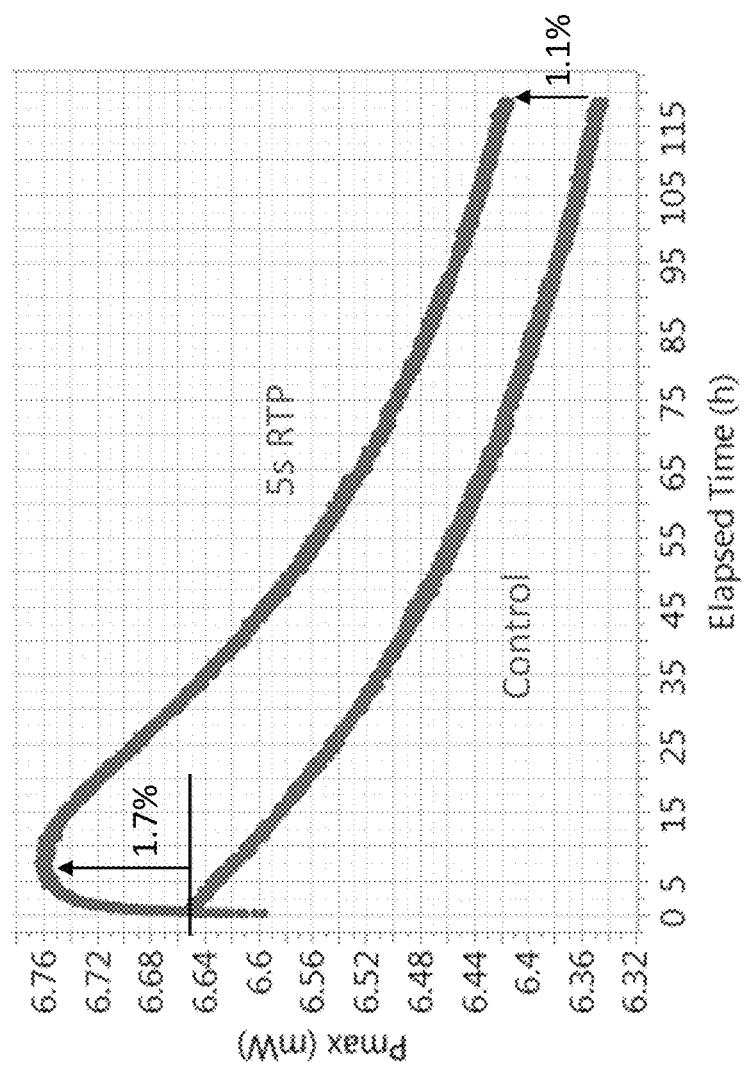

FIGS. 10A-10C show comparisons of newly manufactured cadmium selenide telluride devices after a five second treatment with broad spectrum white light as compared with controls. FIGS. 10A-10B show charge carrier concentration by depth, as measured by capacitance-voltage technique (CV). The depth of CV plot, shown on the x-axis, corresponds to the depth in the absorber where the doping concentration is measured. The origin of the x-scale is the location of the p-n junction. In this instance, there is also a heavily doped n-type side of the p-n junction, not shown. FIG. 10A shows control carrier concentration at $3\times10^{14}$ cm$^{-3}$ FIG. 10B shows increased carrier concentration after treatment at $3\times10^{15}$ cm$^{-3}$.

FIG. 10C shows the maintained power improvement of a module over time, after treatment, as compared with a control. The treated module showed an improved power generation of more than 1% after more than 100 hours of ALT. This indicates that the treatment provides sustained enhanced performance.

In some example embodiments the radiant energy may be delivered by a light knife with a beam length spanning the width of the device and having a beam width in a range of about 0.1 mm to 1.0 cm.

In another post-manufacturing example method, a reactivation treatment is performed on completed, newly-manufactured devices, after module assembly and prior to shipment or installation in an array. In an example, the modules are processed on a conveyor line with a laser.

The wavelength of the laser beam may be any suitable wavelength to heat the absorber material, and may generally be in a range of from about 250 nm to about 1150 nm. In some embodiments, the absorber material is cadmium telluride (CdTe), and the wavelength is between about 300 nm to about 900 nm, or between about 400 nm to about 750 nm. In some non-limiting examples, the wavelength of the laser beam is about 343 nm, about 450 nm, about 532 nm, about 808 nm, or about 880 nm. However, other wavelengths are possible and encompassed within the scope of the present disclosure. In some embodiments, the wavelength is one of which the absorber material is the primary absorber, and is selected based on the composition of the absorber material.

The optical power of the laser beam may range from about 1 Watt to about 10 kW, or from about 1 W to about 1 kW, or from about 5 W to about 500 W. In one non-limiting example, the power is about 10 W. The desired power of the laser beam may depend on the composition of the absorber material being reactivated, and total beam power would also depend on the lateral beam dimensions to provide required power density on exposed surface (W/cm$^2$).

Radiant exposure or fluence is the radiant energy received by a surface per unit area, or equivalently, the irradiance of a surface, integrated over time of irradiation. A laser beam's radiant exposure measures optical energy delivered per unit area. The radiant fluence or radiant exposure of the laser beam may range from about 0.1 J/cm$^2$ to about 1500 J/cm$^2$, or from about 1.0 J/cm$^2$ to about 200 J/cm$^2$, or from about 5.0 J/cm$^2$ to about 150 J/cm$^2$. In some non-limiting examples, the laser beam delivers radiant exposure at a level of at least about 1.0 J/cm$^2$.

The laser beam may be scanned at a suitable scan velocity. In one non-limiting example, the laser beam scan velocity may range from about 0.0001 msec to about 10 msec.

The energy of the laser beam may range from about 0.01 J to about 1,000 J, or from about 1.0 J to about 500 J, or from about 100 J to about 400 J. In one non-limiting example, the energy of the laser beam is about 250 J.

The laser beam and the module may be configured for relative motion with respect to each other. In some embodiments, the laser beam is moved while the module remains stationary. In some embodiments, the laser beam is stationary while the module is moved. In still other embodiments, both the laser beam and the module move.

The laser beam may be rastered. The working distance between the laser and the surface of the module can be, for example, in a range of from about 50 mm to about 1 m, or from about 100 mm to about 700 mm, or from about 200 mm to about 500 mm. In some embodiments, the laser beam is transmitted as a line beam with a diameter at least as wide as the width of the module, and the line beam has at least about 90% maximum intensity across the entire width of the module.

In some embodiments, the laser used is a continuous wave laser, as opposed to a pulsed laser. Pulsed lasers may have an order of magnitude higher cost per photon, or cost per watt, than continuous wave lasers. The use of a continuous wave laser may provide cost efficient light delivery. While lasers as an energy source for the treatment are discussed here in the context of post-manufacturing treatment, lasers may also be used in field treatment in situ at an installation.

Example: Simulation—Temperature Profiles and Rapid Quenching

Modeling software is used to simulate a CdTe photovoltaic device having an absorber layer of about 3 μm in thickness adjacent a glass substrate. In simulation, varying levels of radiant energy are applied to the absorber layer by electromagnetic energy of varying wavelength and intensity, for varying times. The resulting temperature of the glass substrate and the absorber layer at the interface are simulated as a function of time and distance from the glass surface.

Details of the varying parameters are below in Table 1 and the temperature profiles are shown in the Figures noted in the table.

TABLE 1

Figure 11:
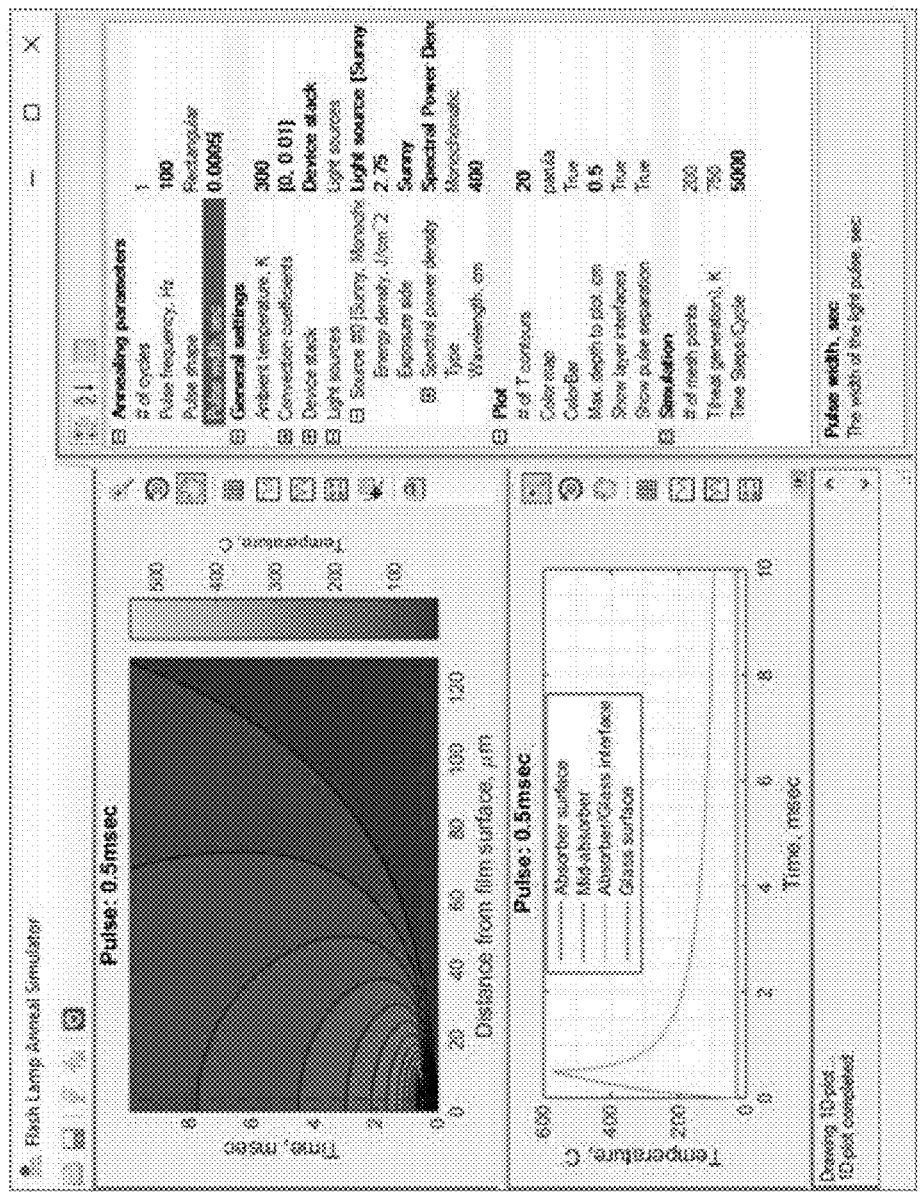
FIG. 11 shows simulation results for specific treatment parameters.
Figure 12:
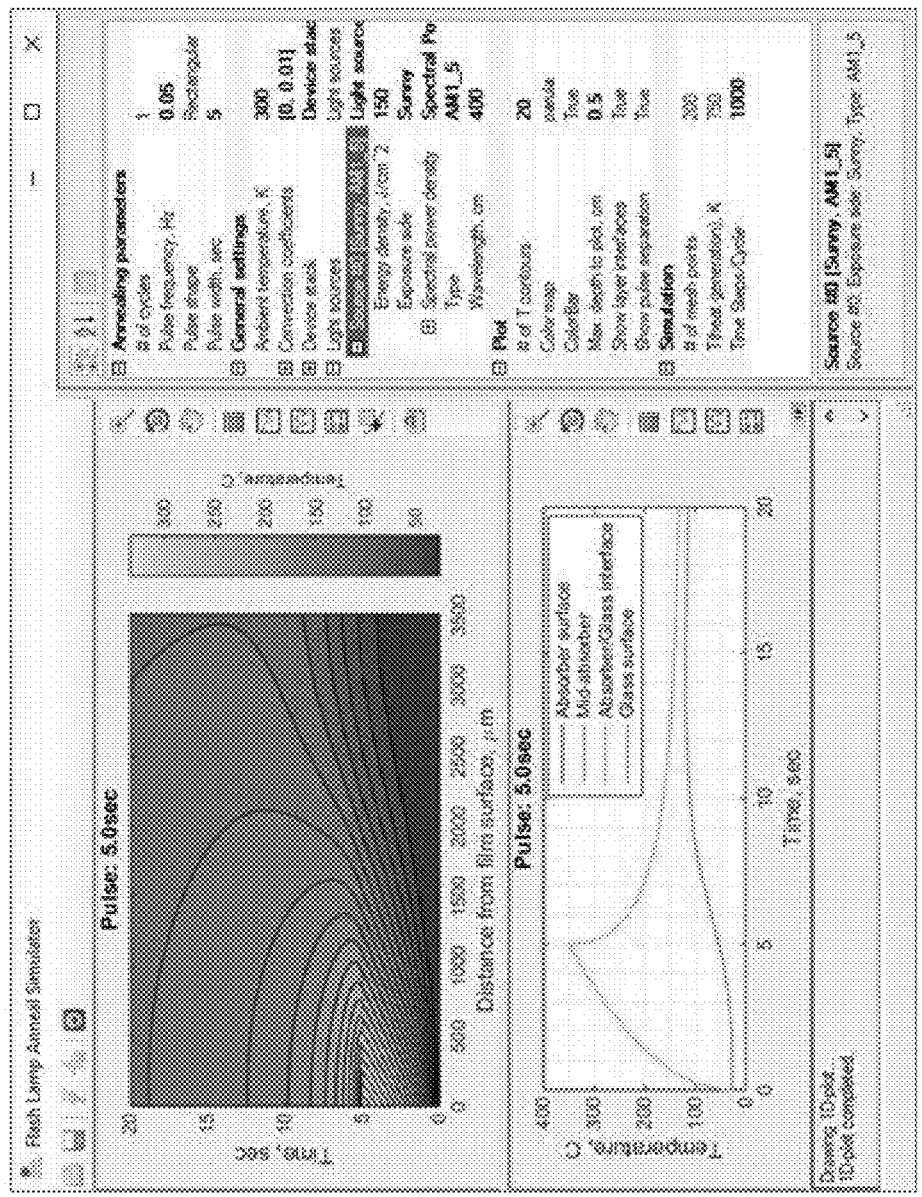
FIG. 12 shows simulation results for another set of treatment parameters.

| Sample # | Pulse Time | Max Absorber Temp (C.) | Energy Density (J/cm$^2$) | Light character | Figure for Profile |
| --- | --- | --- | --- | --- | --- |
| 1 | 0.5 msec | ~550 | 2.75 | monochromatic | FIG. 11 |
| 2 | 5.0 sec. | ~350 | 150 | spectral white | FIG. 12 |

As shown above, modeling software may provide guidance for selection of light characteristics for use in the described methods. One or more light characteristics may be paired with relevant device features using the modeling software to optimize efficacy of reactivation treatment. Relevant device features may include: absorber thickness, semiconductor composition, dopant levels, junction depth, or thermal mass. Light characteristics may include: intensity, duration, energy density, pulsed or constant, or wavelength. Absorption may also vary with temperature due to decreasing bandgap at higher temperatures. The light wavelength or spectral range may be selected to be well absorbed by the specific absorber layer.

In the present invention, the rapid heating step creates disassociation of the undesirable compensating donor complexes, while the rapid quenching step "freezes" the absorber, allowing restoration of the intentional dopant-defect acceptor configurations within the p-type absorber lattice. The rapidity of the heating and quenching define the temperature profile: Steep ramp-up to the desired temperature and steep ramp-down are desirable to "freeze" the dopant chemical reactions in the desired "acceptor" state. However, rapid energy input that is too short in duration, may not allow sufficient time for the kinetics of dopant reactions. And, since shorter duration pulses are correlated with higher energy intensity to achieve the target temperatures, the higher energy may adversely impact other parts of the photovoltaic device. The optimal combination of pulse duration and energy intensity depends on the specifics of the absorber layer, including composition and thickness, and the dopants to be reactivated, as well as the heat tolerance of other portions of the module being treated. This is demonstrated by comparing FIGS. 11 and 12. In FIG. 12, energy is applied for 5 seconds. The absorber temperature ramps ups slowly over the 5 seconds and the glass becomes significantly warmer. In contrast, in FIG. 11, the energy is applied for a much shorter time of 0.5 milliseconds. In the example with a shorter duration of energy application, the absorber layer attains a very high temperature rapidly and cools very quickly without much change in the glass temperature.

It should now be understood that the embodiments provided herein, relate to improved module maintenance and performance enhancing technology. This technology is a significant step towards providing durable, high efficiency power production in systems that are currently constrained by degradation mechanisms. The described methods and systems provide options to improve performance of new devices and extend the effective lifetime of existing photovoltaic devices.

According to embodiments herein, provided is a method of treating a fully-formed photovoltaic device disconnected from a load to form an open circuit, the device having an absorber layer comprising a group II-VI p-type semiconductor material doped with an element from group IB, the method comprising: heating at least a portion of the absorber layer of the photovoltaic device to a temperature in a range of 200 C to 1000 C for a duration of up to 60 seconds to promote at least one dopant chemical reaction in the absorber layer; and quenching the at least one dopant chemical reaction by ending the heating and allowing the absorber layer of the photovoltaic device to cool, whereby the absorber layer reaches a temperature below 100 C within 120 seconds after initiating the heating step.

In some embodiments, the step of heating is performed by one or more pulses of electromagnetic energy, and a source of the electromagnetic energy is selected from the set consisting of: a broad spectrum flash lamp, a metal halide lamp, a xenon discharge light, a halogen lamp, a collimated beam, a laser, a gas laser, a continuous wave laser, a pulsed laser, and a light emitting diode. In some embodiments, the source of the electromagnetic energy, or energy source, is white light. In some embodiments, the energy source is a single wavelength of light in the visible spectrum.

In some embodiments, the step of heating is performed by one or more pulses of electromagnetic energy having at least one wavelength in a range of 200-1200 nm, 300-1000 nm, 300-900 nm, 350-950 nm, 400-800 nm, or 400-700 nm.

In some embodiments, the step of heating is performed by one or more pulses of electromagnetic energy, wherein the one or more pulses of electromagnetic energy are directed at a surface of the device for a duration in a range from 100 nanoseconds to 10 seconds, 100 nanoseconds to 10 milliseconds, 0.001 milliseconds to 10 seconds, from 0.001 milliseconds to 5 seconds, or from 0.01 milliseconds to 1 second.

In some embodiments, the step of heating is performed by one or more pulses of electromagnetic energy, wherein the one or more pulses of electromagnetic energy are configured to deliver radiant exposure at a level of from 0.1 J/cm$^2$ to 2000 J/cm$^2$, 1.0 J/cm$^2$ to 1000 J/cm$^2$, 10 J/cm$^2$ to 500 J/cm$^2$, or 20 J/cm$^2$ to 200 J/cm$^2$. In some embodiments, the step of heating is performed by one or more pulses of electromagnetic energy, wherein the one or more pulses of electromagnetic energy are configured to deliver radiant exposure at a level of about 100-250 J/cm$^2$.

In some embodiments, the steps of heating and quenching are performed in rapid succession to define a temperature profile in the absorber layer. In some embodiments, the absorber layer reaches at least 300 C within 5 seconds and cools to below 100 C within 10 seconds. In some embodiments, the absorber layer reaches at least 400 C within 5 seconds and cools to below 100 C within 10 seconds. In some embodiments, the absorber layer reaches at least 500 C within 1 second and cools to below 100 C within 3 seconds. In some embodiments, the absorber layer reaches at least 500 C within 0.5 seconds and cools to below 100 C within 2 seconds. In some embodiments, the absorber layer reaches at least 500 C within 0.25 seconds and cools to below 100 C within 1 second.

In some embodiments, the heating step produces a temperature in a range of 270 C to 330 C in the absorber layer. In some embodiments, the heating step produces a temperature in a range of 270 C to 330 C in the absorber layer and is cooled from 270 C to below 100 C within three minutes.

In some embodiments, the group II-VI p-type semiconductor material comprises cadmium and at least one of selenium or tellurium, and the group IB dopant comprises copper. In some embodiments, a method of reactivating a copper dopant in a II-VI semiconductor material of a photovoltaic device is provided.

In some embodiments, the group II-VI semiconductor material comprises cadmium and at least one of selenium or tellurium, the group IB dopant comprises at least one of silver or copper, and the semiconductor layer further comprises a halogen dopant. In some embodiments, the group II-VI semiconductor material includes mercury. In some embodiments, the group II-VI semiconductor material includes zinc.

In some embodiments, the group II-VI semiconductor material consists essentially of doped cadmium telluride.

In some embodiments, the group II-VI semiconductor material consists essentially of doped cadmium selenium telluride.

In some embodiments, the group IB dopant consists essentially of copper and/or silver.

In some embodiments, heating the absorber layer induces at least one dopant complex reaction. In some embodiments, the heating promotes dissociation of $Cl_i$—$Cu_{Cd}$ complexes. In some embodiments, the heating promotes dissociation of $Cl_i$—$Ag_{Cd}$ complexes.

In some embodiments, the absorber layer consists essentially of cadmium and tellurium and is doped with copper and chlorine, and the heating promotes dissociation of $Cl_i$—$Cu_{Cd}$ complexes.

In some embodiments, a free carrier concentration of the absorber layer of the photovoltaic device prior to the heating is less than $1\times10^{14}$ cm$^{-3}$, and the free carrier concentration of the absorber layer of the photovoltaic device following the quenching is in a range between $1\times10^{15}$ cm$^{-3}$ and $1\times10^{16}$ cm$^{-3}$.

In some embodiments, a free carrier concentration of the absorber layer of the photovoltaic device prior to the heating is less than $5\times10^{14}$ cm$^{-3}$, and the free carrier concentration of the absorber layer of the photovoltaic device following the quenching is in a range between $1\times10^{15}$ cm$^{-3}$ and $1\times10^{17}$ cm$^{-3}$.

According to embodiments herein, a method is provided for treating a photovoltaic device, the photovoltaic device having at least one absorber layer comprising a group II-VI semiconductor material and at least one dopant, the method comprising: heating at least a portion of the absorber layer of the photovoltaic device to a temperature in a range of 200 C to 1000 C for a duration of up to 60 seconds; and cooling the portion of the absorber layer of the photovoltaic device to a temperature below 100 C within 360 seconds after initiating the heating step.

In some embodiments, the photovoltaic device is fully formed prior to treatment. The photovoltaic device may be disconnected from a load to form an open circuit. In some embodiments, the photovoltaic device has an absorber layer comprising a group II-VI semiconductor material. In some embodiments, the photovoltaic device has an absorber layer comprising a p-type semiconductor material. In some embodiments, the absorber layer is doped with a group I dopant or a group V dopant. In some embodiments, the group V dopant is arsenic, phosphorous, or antimony. In some embodiments, the absorber layer is doped with a halogen. In some embodiments, the absorber layer is doped with a halogen and either a group IB dopant or a group VA dopant. In some embodiments, the absorber layer is doped with an element from group IB. In some embodiments, the absorber layer is doped with an element from group IB and a halogen.

In some embodiments, the method includes cooling the absorber layer of the photovoltaic device to a temperature below 100 C, or to a temperature in a range of 5 C to 100 C within a period in a range of 0.01 seconds to 360 seconds after initiating the heating step. In some embodiments, the method includes cooling the absorber layer to a temperature in a range of 10 C to 100 C within a period in a range of 1 to 240 seconds, within 0.1 to 120 seconds, within 0.01 to 60 seconds, within less than 30 seconds, within less than 10 seconds, within less than 5 seconds, within less than 3 seconds, or within less than 2 seconds. In some embodiments, the heating promotes at least one dopant chemical reaction in the absorber layer. In some embodiments, the cooling quenches the at least one dopant chemical reaction.

In some embodiments, the photovoltaic device is treated after storage and prior to installation. In some embodiments, the photovoltaic device is treated after a period of storage duration in a range of three to twenty-four months. In some embodiments, the photovoltaic device is treated after installation. In some embodiments, the photovoltaic device is treated after installation and after a period of use. In some embodiments, the photovoltaic device is treated after detection of a decline in efficiency of 5-25% relative to a nominal rated power output at the time of installation of a new device of the same type. In some embodiments, the photovoltaic device is treated after detection of a decline in efficiency of more than about 5%, more than about 10%, more than about 20%, or a decline of 5% to 50%. In some embodiments, the photovoltaic device is treated after a period of use in a range of six months to twenty years. In some embodiments, the photovoltaic device is treated periodically every one to five years.

In some embodiments, the heating comprises simultaneously directing electromagnetic energy to an area of less than 50% of an energy side of the photovoltaic device. In some embodiments, the electromagnetic energy is simultaneously directed to an area of 0.0001% to 50.0%, 0.0001 to 30.0%, 0.0001 to 20.0%, 0.0001 to 10.0%, 0.0001 to 2.0%, 0.001 to 1.0%, 0.01 to 15.0%, or 0.1 to 5.0% of the energy side of the photovoltaic device.

In some embodiments, the heating comprises simultaneously directing electromagnetic energy to an area of 90% to 100% of an energy side of the photovoltaic device. In some embodiments, the heating comprises simultaneously directing electromagnetic energy substantially all of an energy side of the photovoltaic device.

In some embodiments, the method is performed on an installed photovoltaic device in situ.

In some embodiments, the photovoltaic device is installed as a module connected to an array, and the method includes: disconnecting the module from the array prior to the heating step, and reconnecting the module to the array after the quenching step.

In some embodiments, the quenching step includes actively cooling a surface of the photovoltaic device by directing a fluid to contact the surface. In some embodiments, the fluid has a temperature in a range between 5 C to 45 C immediately prior to contacting the surface. In some embodiments, the fluid is a gas. In some embodiments, the fluid is water. In some embodiments, the fluid is a fluid mixture. In some embodiments, the fluid is a cleaning or desoiling solution. In some embodiments, the fluid is applied as a liquid. In some embodiments, the fluid comprises compressed air.

In some embodiments, the method is performed on a deployed photovoltaic device, removed from an array, and the device is unmounted and moved to a treatment apparatus for treatment. In some embodiments, a treatment apparatus is configured to be stationary, such that the system is configured to be set up at a maintenance location near an array, such that a plurality of photovoltaic devices are dismounted and disconnected from the array, and transported to the apparatus at the maintenance location, and a plurality of devices are treated at the maintenance location.

According to embodiments herein, provided is a system and method of reactivating a dopant in a degraded photovoltaic device, the device having an absorber layer comprising a group II-VI p-type semiconductor material doped with an element from group IB, the method including the steps of: disconnecting the photovoltaic device from a load to form an open circuit; directing electromagnetic energy toward an energy side of the device for a duration of up to 60 seconds, to heat at least a portion of the absorber layer of the photovoltaic device to a temperature in a range of 200 C to 1000 C and promote at least one dopant chemical reaction in the absorber layer; and quenching the at least one dopant chemical reaction by ending the heating and allowing the absorber layer of the photovoltaic device to cool, whereby the absorber layer reaches a temperature below 100 C within 120 seconds after initiating the heating step.

According to embodiments herein, provided is an apparatus and system for reactivating charge carriers in a photovoltaic device mounted in an array, the photovoltaic device having an absorber layer comprising cadmium, tellurium, and at least one dopant, the apparatus including: an energy source configured to generate at least one wavelength in a range of 300-950 nm, at an intensity to deliver radiant exposure at a level in a range from 0.1 J/cm$^2$ to 2000 J/cm$^2$, to at least a portion of the photovoltaic device, over a duration in a range from 100 nanoseconds to 10 seconds; and a positioning structure configured to align the energy source in relation to the photovoltaic device mounted in the array, wherein the apparatus is portable, such that the system is configured to treat one or more photovoltaic devices disconnected from the array, while mounted in the array, in situ, and wherein the system is configured to be moved from a first photovoltaic device to a second photovoltaic device in the array.

In some embodiments, the apparatus is configured to deliver radiant exposure to an area of 0.00001% to 10.0% of an energy side of the photovoltaic device.

In some embodiments, the apparatus is configured to deliver radiant exposure to an area of 1% to 50% of an energy side of the photovoltaic device.

In some embodiments, the apparatus is configured to deliver radiant exposure to an area of 90% to 100% of an energy side of the photovoltaic device.

In some embodiments, the photovoltaic device is a deployed module having compensating donor complexes. In some embodiments, prior to treatment, the photovoltaic device is degraded such that a pre-treatment produced power is below a nominal rating, such that the degraded device produces less than 90%, 80%, 75%, 70%, 60%, 50%, or 25% of its nominal rated power output at the time of installation. In some embodiments, after treatment, the recovered or reactivated device has a post-treatment produced power relative to a nominal rating, such that the reactivated device has improved power output relative to its pretreatment performance, and produces more than 70%, 75%, 80%, 90%, 95%, or 100% of its nominal rated power output at the time of installation.

In some embodiments, the energy source or source of electromagnetic energy is one or more of: a broad spectrum flash lamp, a metal halide lamp, a xenon discharge light, a halogen lamp, a collimated beam, a light knife, a laser, a gas laser, a continuous wave laser, a pulsed laser, or a set of light emitting diodes.

Provided systems and methods modulate defect chemistry in thin film layers containing group II-VI doped semiconductor materials. Embodiments of the method provide a process for reactivating charge carriers in completed modules, including fully-formed and deployed photovoltaic devices. Embodiments may be used to extend the life-span of photovoltaic devices.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of treating a fully-formed photovoltaic device disconnected from a load to form an open circuit, the device having an absorber layer comprising a group II-VI p-type semiconductor material doped with an element from group IB, the method comprising:
   heating at least a portion of the absorber layer of the photovoltaic device to a temperature in a range of 200 C to 1000 C for a duration of up to 60 seconds to promote at least one dopant chemical reaction in the absorber layer; and
   quenching the at least one dopant chemical reaction by ending the heating and allowing the absorber layer of the photovoltaic device to cool, whereby the absorber layer reaches a temperature below 100 C within 120 seconds after initiating the heating step,
   wherein the absorber layer comprises cadmium and tellurium and is doped with copper and chlorine, and the heating promotes dissociation of $Cl_i$—$Cu_{Cd}$ complexes.

2. The method of claim 1, wherein the step of heating is performed by one or more pulses of electromagnetic energy having at least one wavelength in a range of 200-1200 nm.

3. The method of claim 1, wherein the step of heating is performed by one or more pulses of electromagnetic energy, and a source of the electromagnetic energy is selected from the set consisting of: a broad spectrum flash lamp, a metal halide lamp, a xenon discharge light, a halogen lamp, a collimated beam, a laser, a gas laser, a continuous wave laser, a pulsed laser, and a light emitting diode.

4. The method of claim 1, wherein the step of heating is performed by one or more pulses of electromagnetic energy, wherein the one or more pulses of electromagnetic energy are directed at a surface of the device for a duration in a range from 0.001 milliseconds to 10 seconds.

5. The method of claim 1, wherein the step of heating is performed by one or more pulses of electromagnetic energy, wherein the one or more pulses of electromagnetic energy are configured to deliver radiant exposure at a level of from 0.1 $J/cm^2$ to 2000 $J/cm^2$.

6. The method of claim 1, wherein the steps of heating and quenching are performed in rapid succession to define a temperature profile in the absorber layer, wherein:
   the absorber layer reaches at least 300 C within 5 seconds and cools to below 100 C within 10 seconds.

7. The method of claim 1, wherein the heating step produces a temperature in a range of 270 C to 330 C in the absorber layer.

8. The method of claim 1, wherein the group II-VI p-type semiconductor material comprises selenium.

9. The method of claim 1, wherein the absorber layer is doped with silver.

10. The method of claim 1, wherein:
    a free carrier concentration of the absorber layer of the photovoltaic device prior to the heating is less than $5 \times 10^{14}$ $cm^{-3}$, and the free carrier concentration of the absorber layer of the photovoltaic device following the quenching is in a range between $1 \times 10^{15}$ $cm^{-3}$ and $1 \times 10^{17}$ $cm^{-3}$.

11. The method of claim 1, wherein the heating comprises: simultaneously directing electromagnetic energy to an area of less than 50% of an energy side of the photovoltaic device, wherein the electromagnetic energy is simultaneously directed to an area of 0.0001% to 50.0%.

12. The method of claim 1, wherein the heating comprises: simultaneously directing electromagnetic energy to an area of 90% to 100% of an energy side of the photovoltaic device.

13. The method of claim 1, wherein the photovoltaic device is installed as a module connected to an array and wherein the method further comprises: disconnecting the module from the array prior to the heating step; and reconnecting the module to the array after the quenching step.

14. The method of claim 1, wherein the quenching step further comprises: actively cooling a surface of the photovoltaic device by directing a fluid to contact the surface, wherein the fluid has a temperature in a range between 5 C to 45 C.

15. A method of reactivating a dopant in a degraded photovoltaic device, the device having an absorber layer comprising a group II-VI p-type semiconductor material doped with an element from group IB, the method comprising:
    disconnecting the photovoltaic device from a load to form an open circuit;
    directing electromagnetic energy toward an energy side of the device, for a duration of up to 60 seconds, to heat at least a portion of the absorber layer of the photovoltaic device to a temperature in a range of 200 C to 1000 C and promote at least one dopant chemical reaction in the absorber layer; and
    quenching the at least one dopant chemical reaction by ending the heating and allowing the absorber layer of the photovoltaic device to cool, whereby the absorber layer reaches a temperature below 100 C within 120 seconds after initiating the heating step,
    wherein the absorber layer comprises cadmium and tellurium and is doped with copper and chlorine, and the heating promotes dissociation of $Cl_i$—$Cu_{Cd}$ complexes.

16. The method of claim 15, wherein the method is performed on an installed photovoltaic device in situ.

17. The method of claim 1, wherein the step of heating is performed by one or more pulses of electromagnetic energy having at least one wavelength in a range of 400-700 nm.

18. The method of claim 1, wherein the step of heating is performed by one or more pulses of electromagnetic energy, wherein the one or more pulses of electromagnetic energy are directed at a surface of the device for a duration in a range from 0.001 milliseconds to 5 seconds.

19. The method of claim 1, wherein the step of heating is performed by one or more pulses of electromagnetic energy, wherein the one or more pulses of electromagnetic energy are configured to deliver radiant exposure at a level of from 1.0 $J/cm^2$ to 500 $J/cm^2$.

20. The method of claim 1, wherein the steps of heating and quenching are performed in rapid succession to define a temperature profile in the absorber layer, wherein:
    the absorber layer reaches at least 400 C within 5 seconds and cools to below 100 C within 10 seconds.

* * * * *